(12) United States Patent  
Okabe et al.

(10) Patent No.: US 12,446,442 B2
(45) Date of Patent: Oct. 14, 2025

(54) DISPLAY DEVICE

(71) Applicant: SHARP KABUSHIKI KAISHA, Sakai (JP)

(72) Inventors: Tohru Okabe, Sakai (JP); Shinsuke Saida, Sakai (JP); Shinji Ichikawa, Sakai (JP); Ryosuke Gunji, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 638 days.

(21) Appl. No.: 17/796,241

(22) PCT Filed: Feb. 13, 2020

(86) PCT No.: PCT/JP2020/005615
§ 371 (c)(1),
(2) Date: Jul. 28, 2022

(87) PCT Pub. No.: WO2021/161465
PCT Pub. Date: Aug. 19, 2021

(65) Prior Publication Data
US 2023/0077957 A1    Mar. 16, 2023

(51) Int. Cl.
*H10K 59/80*     (2023.01)
*H10K 50/17*     (2023.01)
*H10K 59/124*    (2023.01)
*H10K 59/131*    (2023.01)
*H10K 59/65*     (2023.01)

(52) U.S. Cl.
CPC ......... *H10K 59/873* (2023.02); *H10K 59/124* (2023.02); *H10K 59/8731* (2023.02); *H10K 50/17* (2023.02); *H10K 50/171* (2023.02); *H10K 59/131* (2023.02); *H10K 59/65* (2023.02)

(58) Field of Classification Search
CPC .... H10K 59/124; H10K 59/131; H10K 59/65; H10K 59/8731; H10K 59/873; H10K 50/844; H10K 50/17; H10K 50/171; H10K 50/15; H10K 50/16; H10K 77/10; G09F 9/30
See application file for complete search history.

(56) References Cited

U.S. PATENT DOCUMENTS

| | | | |
|---|---|---|---|
| 2007/0188093 A1 | 8/2007 | Nagara et al. | |
| 2018/0090722 A1* | 3/2018 | Kim | H10K 50/822 |
| 2019/0334120 A1* | 10/2019 | Seo | H10K 59/121 |
| 2020/0168683 A1* | 5/2020 | Son | H10K 50/844 |

(Continued)

FOREIGN PATENT DOCUMENTS

| | | |
|---|---|---|
| JP | 2007250520 A | 9/2007 |
| WO | 2019186712 A1 | 10/2019 |
| WO | 2019186812 A1 | 10/2019 |

*Primary Examiner* — Vongsavanh Sengdara
(74) *Attorney, Agent, or Firm* — ScienBiziP, P.C.

(57) ABSTRACT

A plurality of inner protrusions are provided in a non-display area so as to surround a through hole. Each of the plurality of inner protrusions includes: an underlying resin layer; and an underlying inorganic insulation layer provided on the underlying resin layer. Each underlying resin layer is separated by a plurality of inner slits formed on a surface of a resin substrate layer so as to surround the through hole. The underlying inorganic insulation layer is provided so as to project like an eave from the underlying resin layer to either one or both of a through hole side and a display area side.

18 Claims, 13 Drawing Sheets

(56) References Cited

U.S. PATENT DOCUMENTS

| | | | |
|---|---|---|---|
| 2020/0176520 A1* | 6/2020 | Kim | H10K 59/873 |
| 2020/0194714 A1* | 6/2020 | Won | H10K 59/8731 |
| 2020/0194721 A1* | 6/2020 | Lee | G06F 3/0412 |
| 2020/0235180 A1* | 7/2020 | Park | H10K 59/8731 |
| 2020/0295102 A1* | 9/2020 | Qin | H10K 59/122 |
| 2021/0035477 A1 | 2/2021 | Nakata et al. | |
| 2021/0234122 A1* | 7/2021 | Choi | H02P 11/04 |
| 2021/0234125 A1* | 7/2021 | Sung | H10K 77/00 |
| 2021/0280646 A1* | 9/2021 | Zhang | H10K 59/122 |
| 2021/0320276 A1* | 10/2021 | Chang | H10K 50/844 |
| 2023/0024214 A1* | 1/2023 | Tong | H10K 59/873 |

\* cited by examiner

DISPLAY DEVICE

TECHNICAL FIELD

The present invention relates to display devices.

BACKGROUND ART

The organic EL display device, or the self-luminous display device built around organic electroluminescence (may be referred to as "EL" in the following) elements, has been attracting attention as an alternative to the liquid crystal display device. Here, the organic EL element includes, for example: an organic EL layer including a light-emitting layer; a first electrode provided on one of the surfaces of the organic EL layer; and a second electrode provided on the other surface of the organic EL layer.

For instance, Patent Literature 1 discloses an organic electroluminescence display panel in which the organic EL layer and the second electrode both formed by vapor deposition are divided by a partition wall that has a reverse-tapered portion.

CITATION LIST

Patent Literature

Patent Literature 1: Japanese Unexamined Patent Application Publication, Tokukai, No. 2007-250520

SUMMARY OF INVENTION

Technical Problem

Meanwhile, in the organic EL display device, there is a demand to provide an insular non-display area and a through hole extending thickness-wise through the non-display area, to install, for example, a camera or a fingerprint sensor inside a display area where there is produced an image display. However, since in the display area where there are provided a plurality of subpixels, a functional layer formed common (to all subpixels) by vapor deposition is provided, if the above-described through hole is provided inside the display area, for example, water may flow into the display area through the common functional layer exposed from the through hole. When this happens, since the organic EL layer included in the organic EL element inevitably deteriorates, it is necessary to form the common functional layer separately in the display area side and in the through hole side around the through hole. Note that it is technically difficult to fabricate a vapor deposition mask so as not to form a common functional layer in the through hole inside the display area and in the surrounding portions thereof. Here, to form a common functional layer separately in the display area side and in the through hole side, it is effective to use a reverse-tapered structural body described in Patent Literature 1 above. However, the reverse-tapered structural body will require a negative photosensitive material, and the manufacturing cost will increase. Therefore, there is room for improvement.

In view of the foregoing problems, it is an object of the present disclosure to form a common functional layer separately in the display area side and in the through hole side at low cost.

Solution to Problem

To achieve this object, a display device in accordance with the present disclosure includes: a resin substrate layer; a thin film transistor layer provided on the resin substrate layer and including an underlying inorganic insulation film, an underlying wiring layer, and an organic insulation film, all of which are stacked in a stated order; and a light-emitting element layer provided in the thin film transistor layer and including a plurality of first electrodes, a common functional layer, and a second electrode that is common, all of which are stacked in a stated order, correspondingly to a plurality of subpixels included in a display area, wherein a non-display area that is insular is provided inside the display area, a through hole extending through the resin substrate layer in a direction of a thickness of the resin substrate layer is provided in the non-display area, and an electronic component is disposed in the through hole, wherein a plurality of inner protrusions are provided in the non-display area so as to surround the through hole, each of the plurality of inner protrusions includes: an underlying resin layer including the resin substrate layer; and an underlying inorganic insulation layer provided on the underlying resin layer and made of the same material and in the same layer as the underlying inorganic insulation film, the underlying resin layer in each of the plurality of inner protrusions is separated by a plurality of inner slits formed on a surface on an underlying inorganic insulation film side of the resin substrate layer so as to surround the through hole, and the underlying inorganic insulation layer is provided so as to project like an eave from the underlying resin layer to either one or both of a through hole side and a display area side.

Advantageous Effects of Disclosure

According to the present disclosure, since each inner protrusion, concentrically and annularly provided so as to surround the through hole, includes an underlying resin layer and an underlying inorganic insulation layer, and the underlying inorganic insulation layer is provided so as to project like an eave from the underlying resin layer to either one or both of the through hole side and the display area side, it is possible to form a common functional layer separately in the display area side and in the through hole side at low cost.

DESCRIPTION OF EMBODIMENTS

The following will describe embodiments of the present disclosure in detail with reference to drawings. Note that the present disclosure is by no means limited to the following embodiments.

First Embodiment

Figure 1:
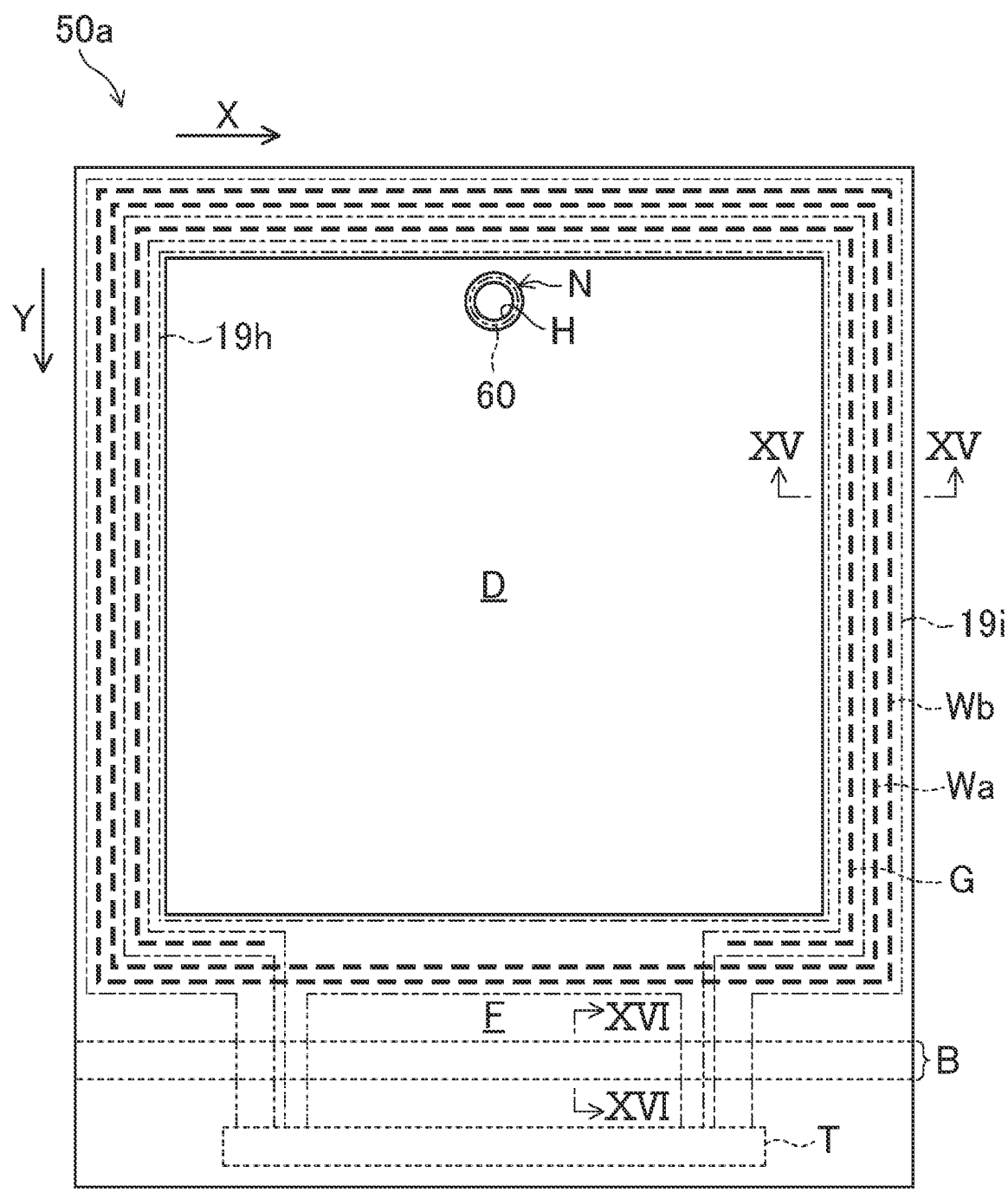
FIG. 1 is a schematic plan view of a structure of an organic EL display device in accordance with a first embodiment of the present disclosure.
Figure 2:
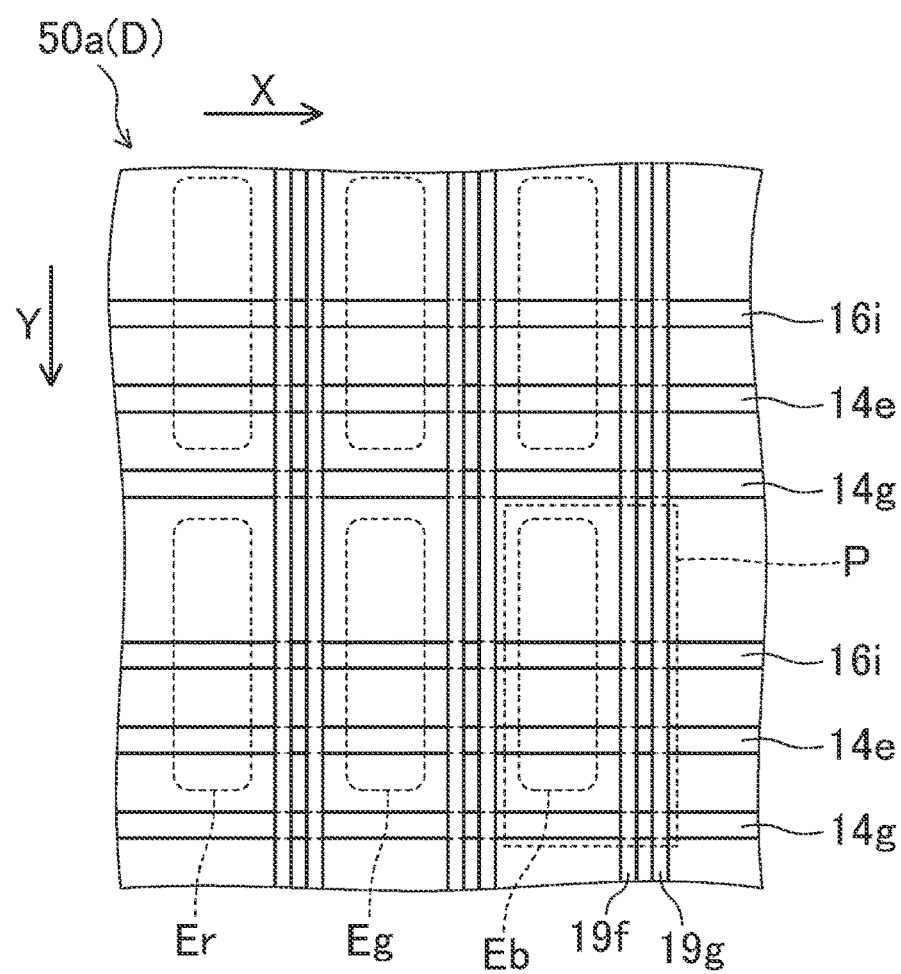
FIG. 2 is a plan view of a display area of the organic EL display device in accordance with the first embodiment of the present disclosure.
Figure 5:
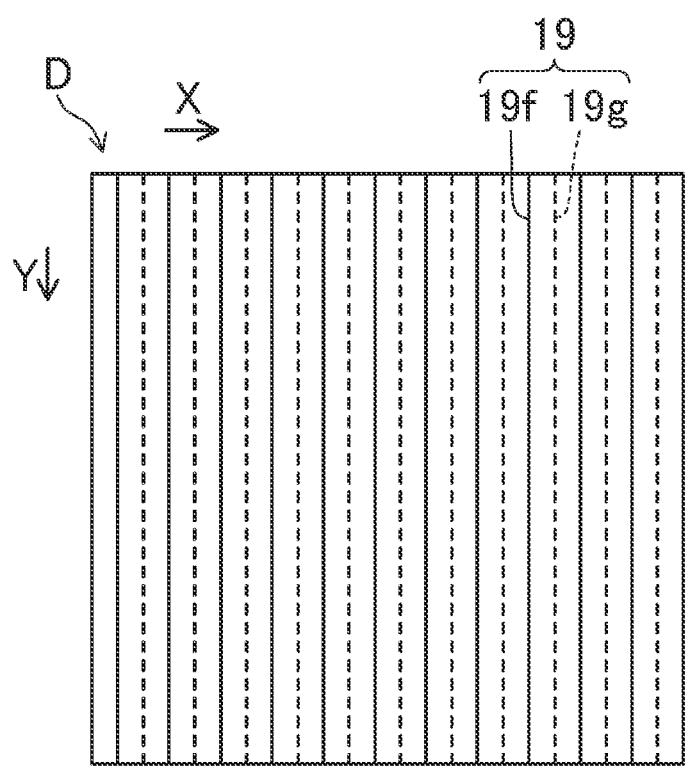
FIG. 5 is a plan view of a third wiring layer provided in the display area of the organic EL display device in accordance with the first embodiment of the present disclosure.
Figure 6:
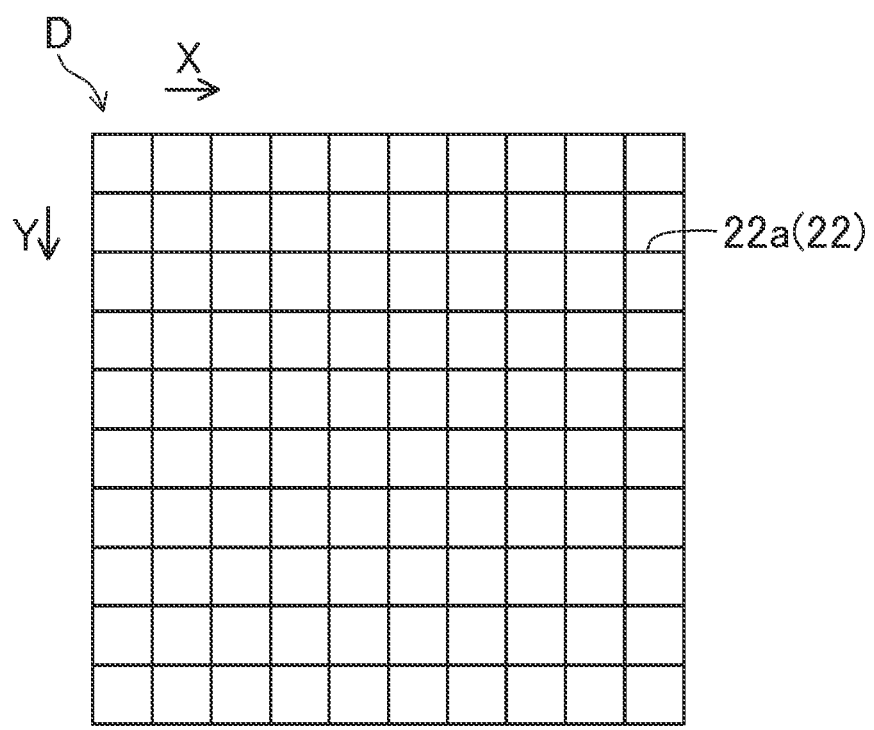
FIG. 6 is a plan view of a fourth wiring layer provided in the display area of the organic EL display device in accordance with the first embodiment of the present disclosure.
Figure 7:
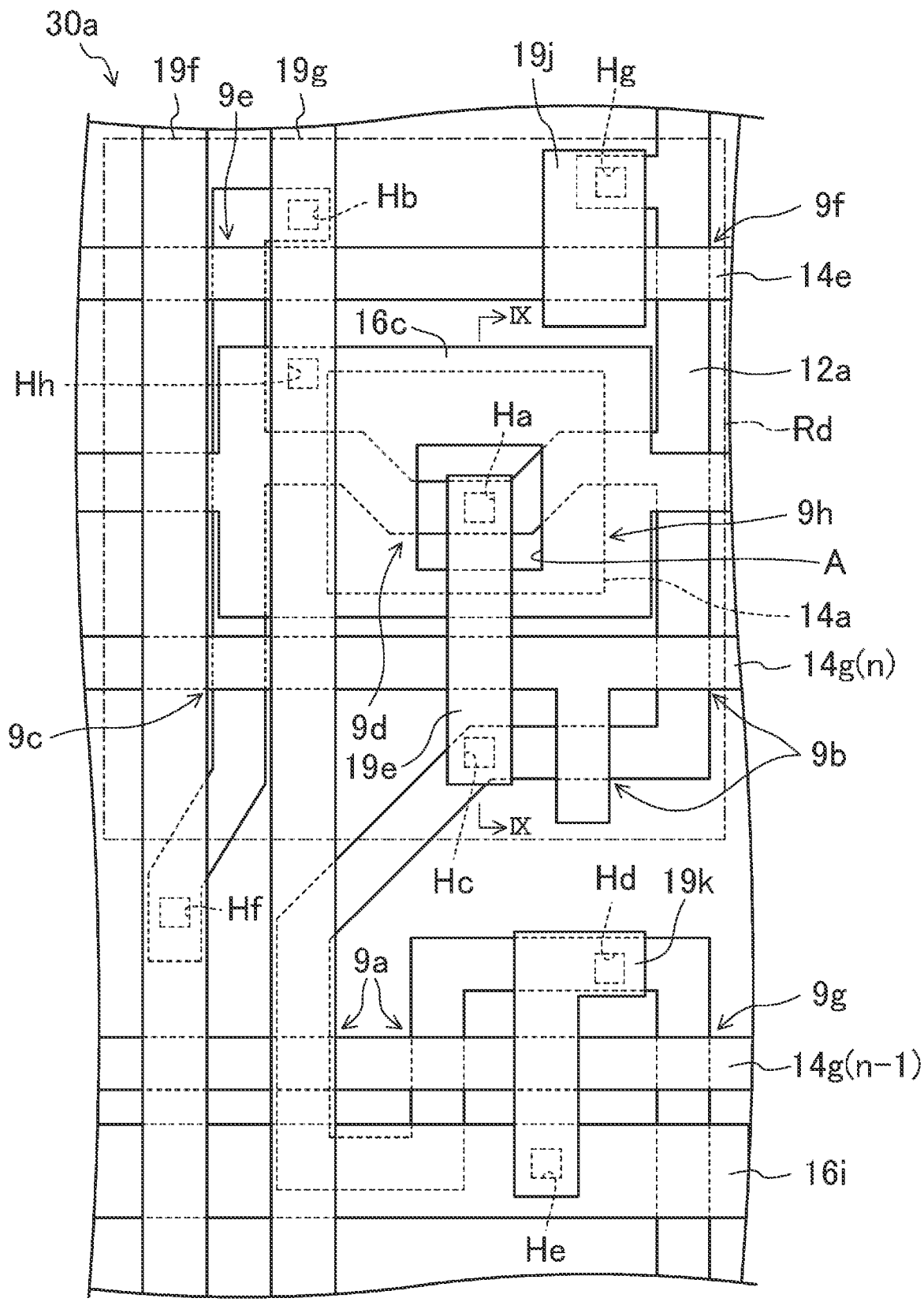
FIG. 7 is a plan view of a TFT layer included in the organic EL display device in accordance with the first embodiment of the present disclosure.
Figure 8:
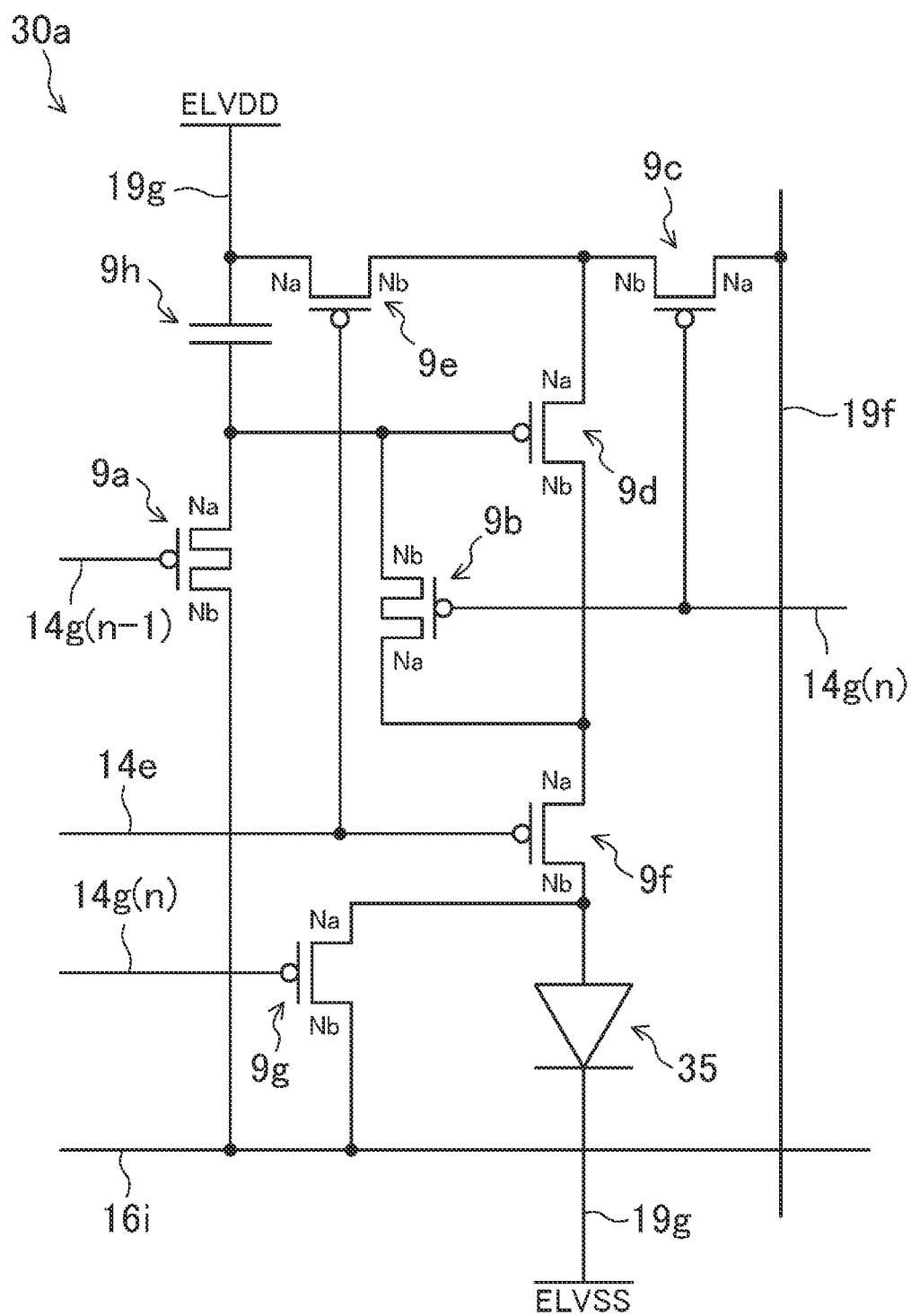
FIG. 8 is an equivalent circuit diagram of the TFT layer included in the organic EL display device in accordance with the first embodiment of the present disclosure.
Figure 9:
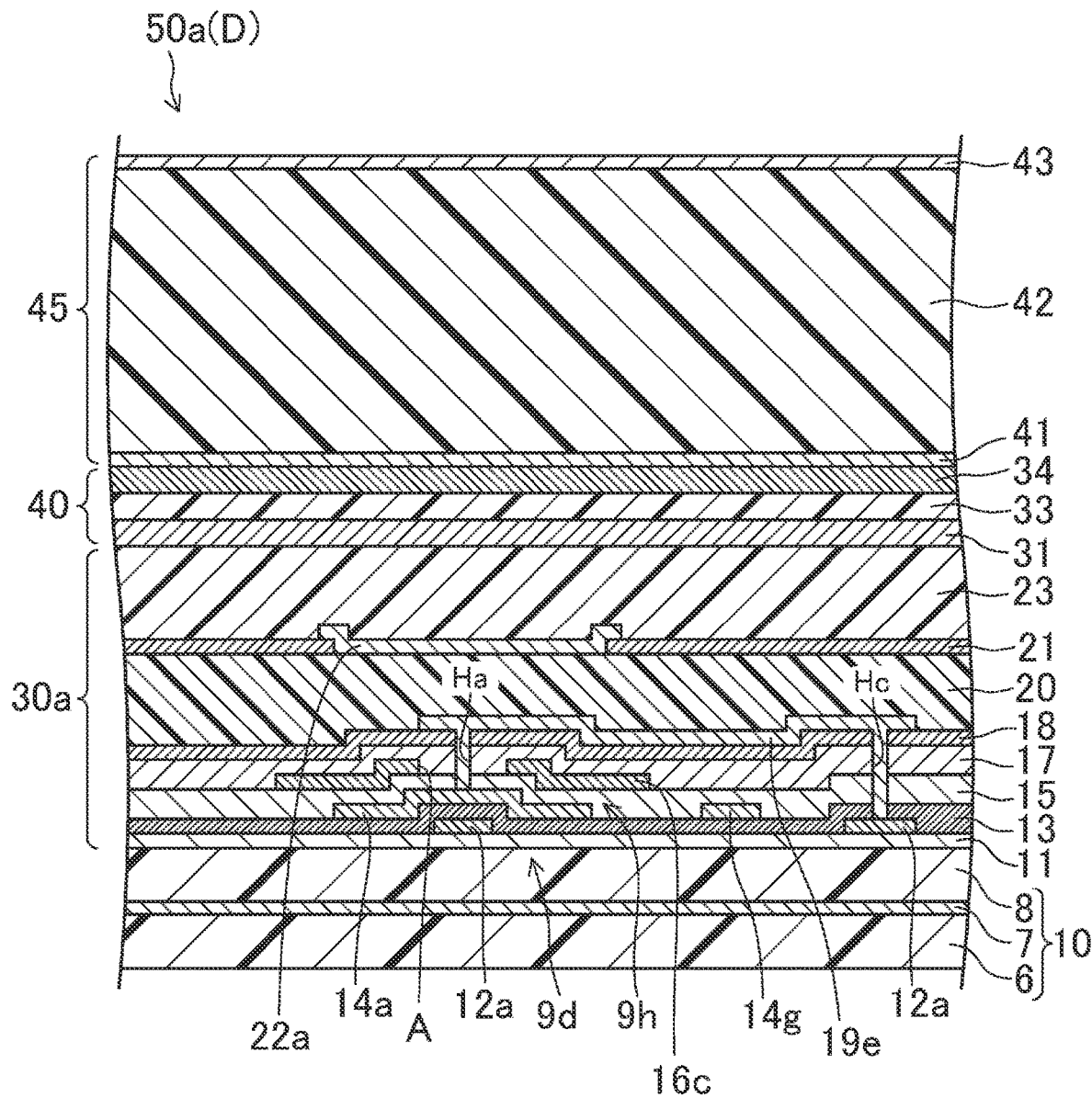
FIG. 9 is a cross-sectional view of the organic EL display device taken along line IX-IX in FIG. 7.
Figure 10:
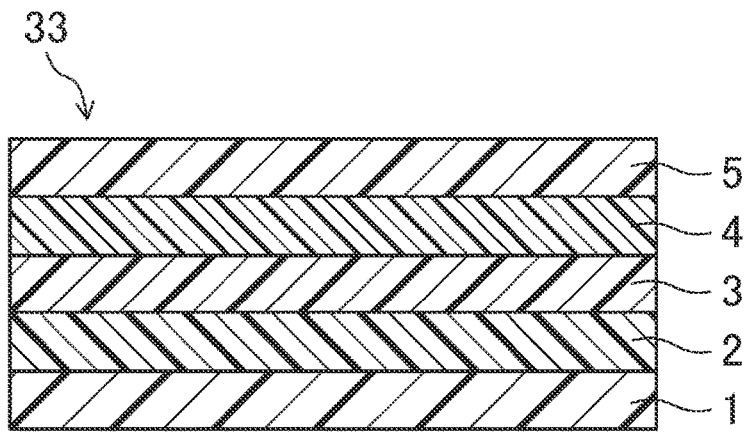
FIG. 10 is a cross-sectional view of an organic EL layer included in the organic EL display device in accordance with the first embodiment of the present disclosure.
Figure 11:
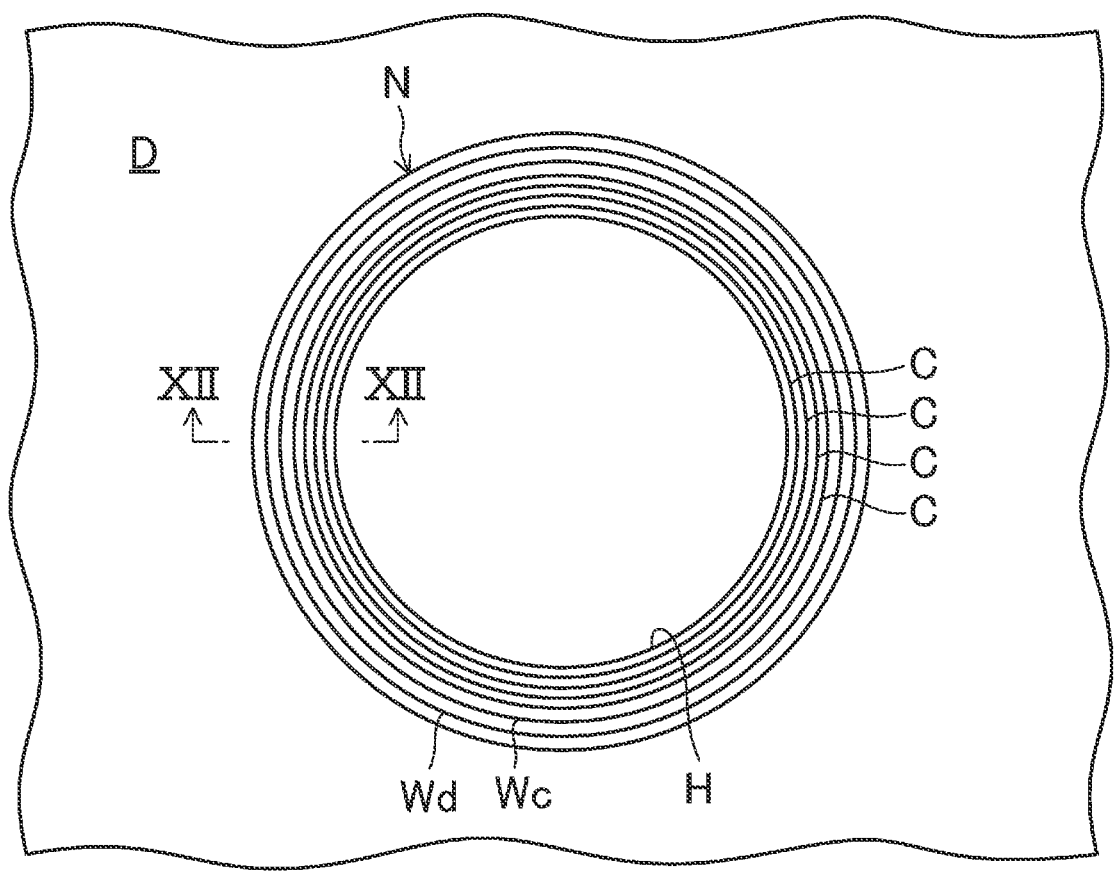
FIG. 11 is a plan view of a non-display area and its surroundings of the organic EL display device in accordance with the first embodiment of the present disclosure.
Figure 12:
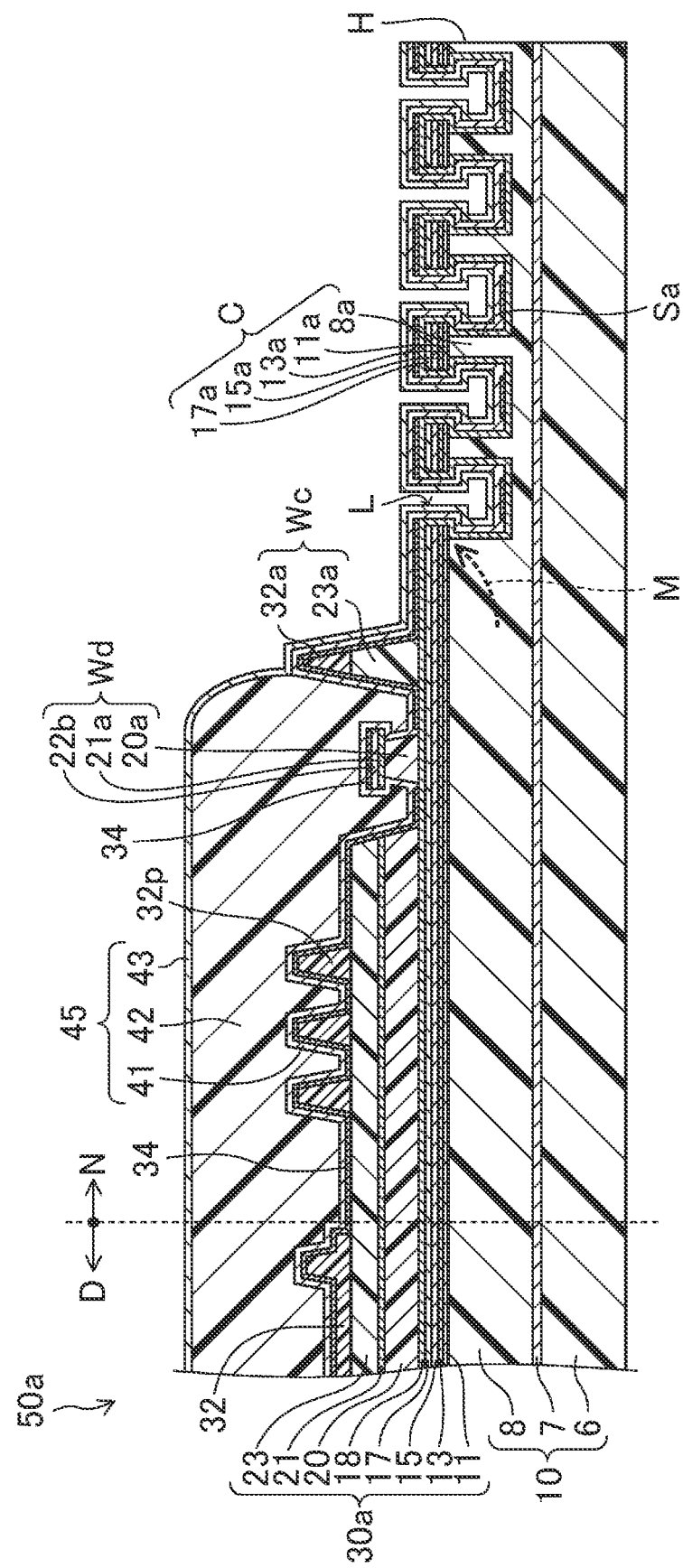
FIG. 12 is a cross-sectional view of the organic EL display device taken along line XII-XII in FIG. 11.
Figure 13:
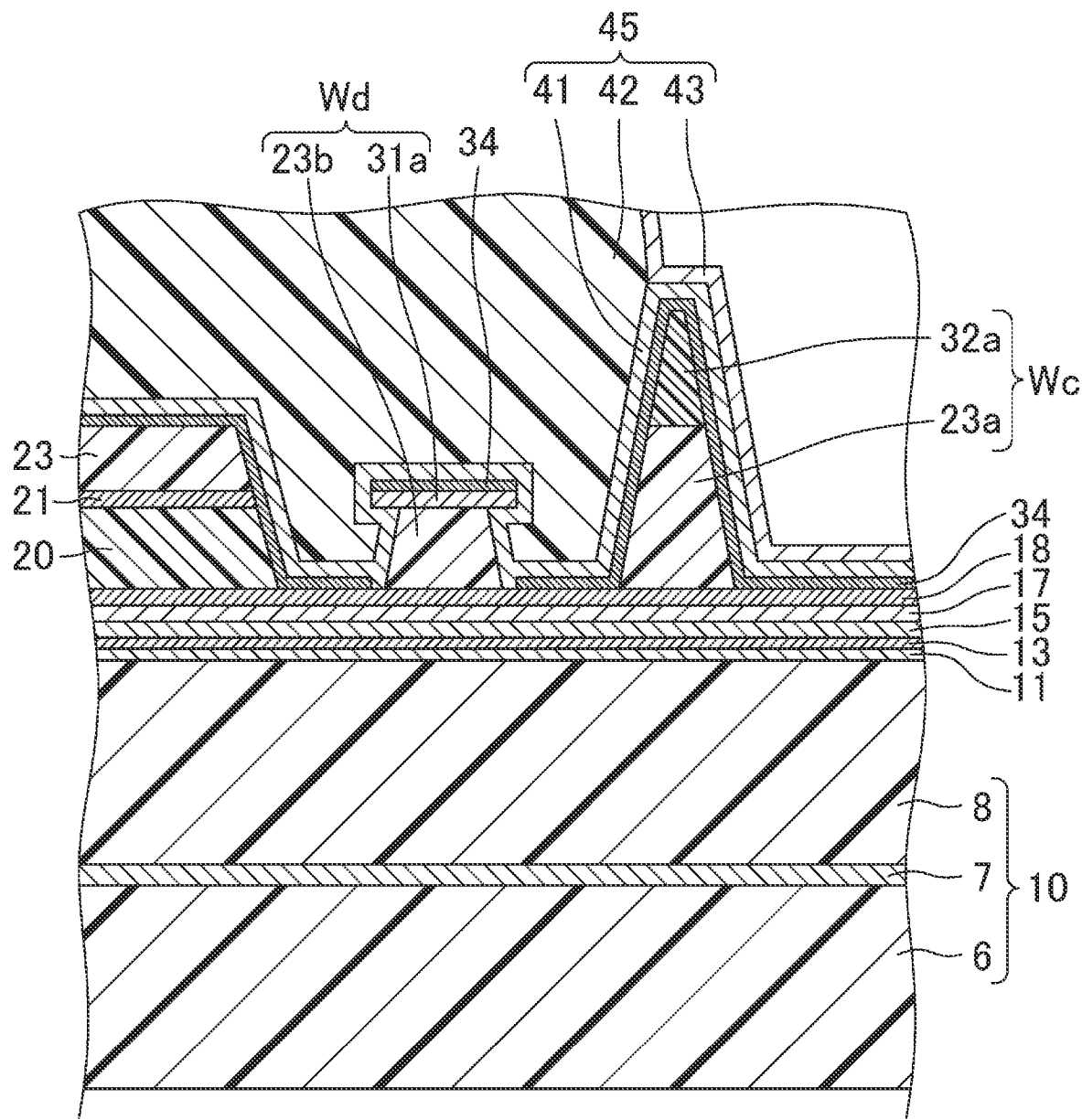
FIG. 13 is a cross-sectional view of a first variation example of an outer protrusion included in the organic EL display device in accordance with the first embodiment of the present disclosure.
Figure 14:
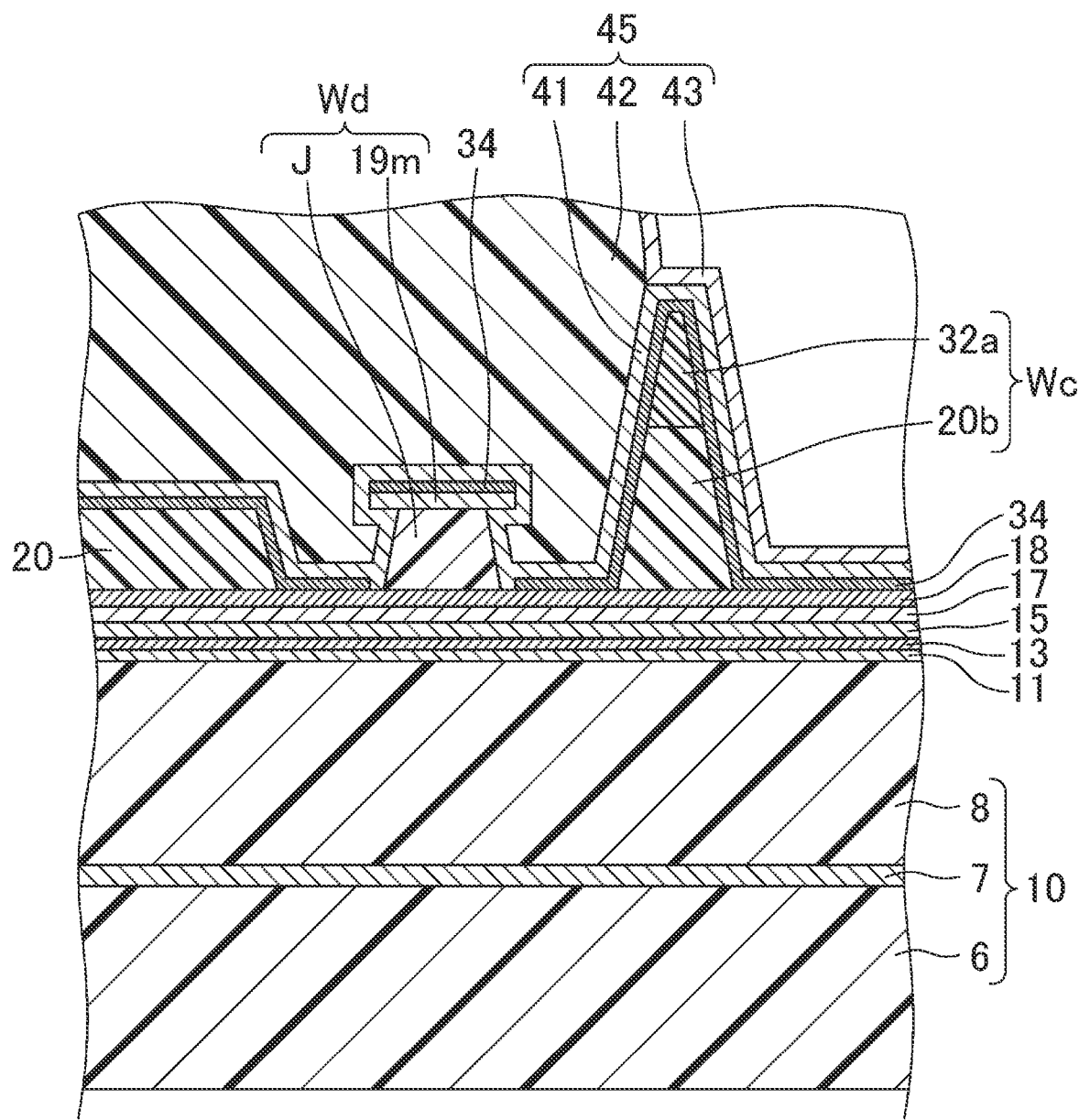
FIG. 14 is a cross-sectional view of a second variation example of the outer protrusion included in the organic EL display device in accordance with the first embodiment of the present disclosure.
Figure 15:
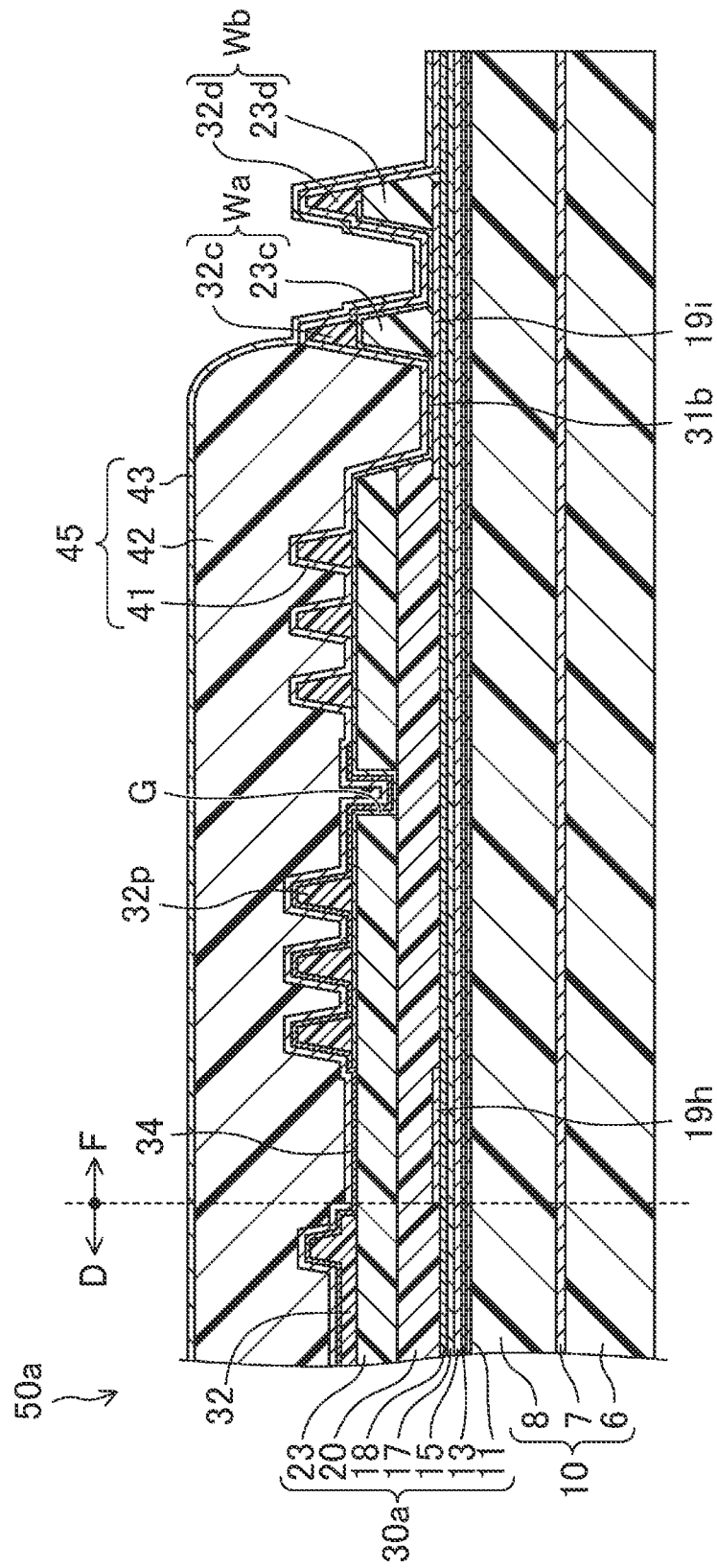
FIG. 15 is a cross-sectional view of the organic EL display device taken along line XV-XV in FIG. 1.
Figure 16:
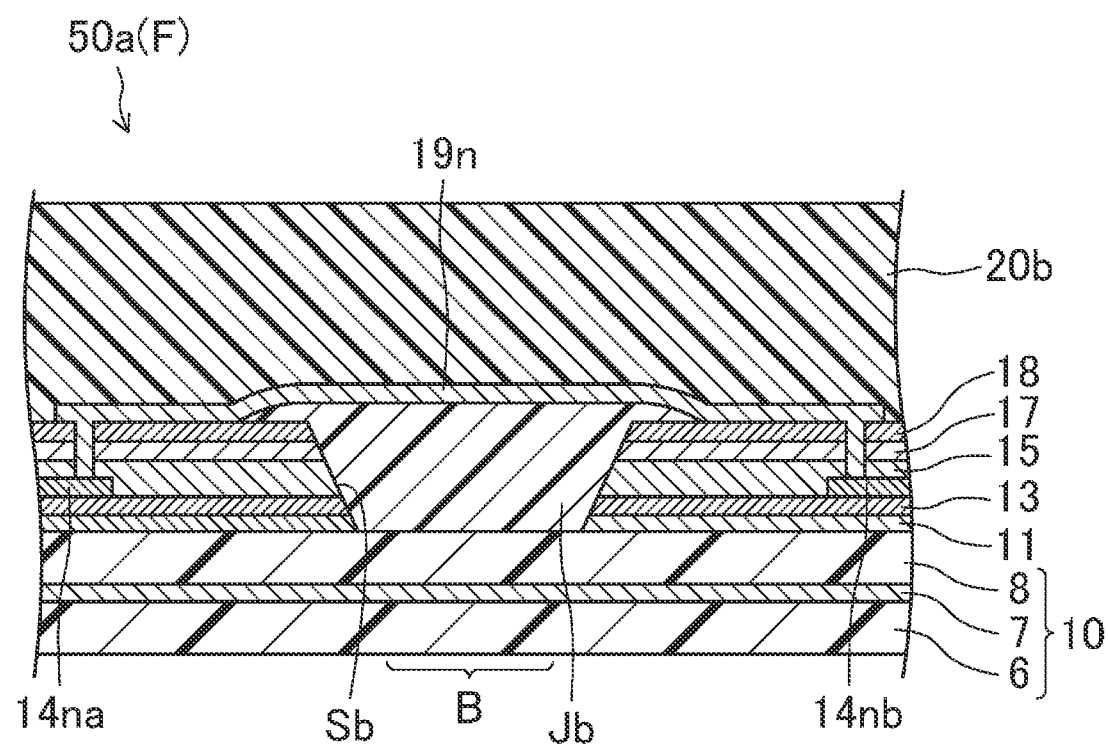
FIG. 16 is a cross-sectional view of the organic EL display device taken along line XVI-XVI in FIG. 1.

FIGS. 1 to 16 represent a first embodiment of the display device in accordance with the present disclosure. Note that the following embodiments will discuss organic EL display devices including organic EL elements as an example of the display device including light-emitting elements. Here, FIG. 1 is a schematic plan view of a structure of an organic EL display device 50a in accordance with the present embodiment. In addition, FIG. 2 is a plan view of a display area D of the organic EL display device 50a. In addition, FIGS. 3, 4, 5, and 6 are plan views of a first wiring layer 14, a second wiring layer 16, a third wiring layer 18, and a fourth wiring layer 22 provided in the display area D of the organic EL display device 50a. In addition, FIG. 7 is a plan view of a TFT layer 30a included in the organic EL display device 50a. In addition, FIG. 8 is an equivalent circuit diagram of the TFT layer 30a. In addition, FIG. 9 is a cross-sectional view of the organic EL display device 50a taken along line IX-IX in FIG. 7. In addition, FIG. 10 is a cross-sectional view of an organic EL layer 33 included in the organic EL display device 50a. In addition, FIG. 11 is a plan view of a non-display area N and its surroundings of the organic EL display device 50a. In addition, FIG. 12 is a cross-sectional view of the organic EL display device 50a taken along line XII-XII in FIG. 11. In addition, FIG. 13 is a cross-sectional view of a first variation example of an outer protrusion Wd included in the organic EL display device 50a. In addition, FIG. 14 is a cross-sectional view of a second variation example of the outer protrusion Wd included in the organic EL display device 50a. In addition, FIGS. 15 and 16 are cross-sectional views of the organic EL display device 50a taken along lines XV-XV and XVI-XVI in FIG. 1.

The organic EL display device 50a, as shown in FIG. 1, has, for example: the rectangular display area D for image displays, and a frame area F shaped like a frame surrounding the display area D. Note that in the present embodiment, the rectangular display area D is described as an example. This "rectangular" shape encompasses generally rectangular shapes including, for example, those with a curved side(s), those with a round corner(s), and those with a notched side(s).

In the display area D, as shown in FIG. 2, there is provided a matrix of subpixels P. Additionally, in the display area D are there provided, for example, subpixels P each of which includes a red-light-emission region Er for producing a red display, subpixels P each of which includes a green-light-emission region Eg for producing a green display, and subpixels P each of which includes a blue-light-emission region Eb for producing a blue display. Three subpixels, one from each of these three types of subpixels P, are arranged adjacent to each other as shown in FIG. 2. Note that in the display area D, a single pixel is composed of, as an example, three adjacent subpixels P that include one of the red-light-emission regions Er, one of the green-light-emission regions Eg, and one of the blue-light-emission regions Eb. Additionally, the insular non-display area N is provided inside the display area D as shown in FIG. 1. Here, in the non-display area N, as shown in FIG. 1, there is provided a through hole H extending thickness-wise through a resin substrate layer 10 (detailed later) to install, for example, an electronic component 60 such as a camera, a fingerprint sensor, and/or a face recognition sensor on the backside.

There is provided a terminal section T extending in one direction (X-direction in the drawing) in the bottom end portion of the frame area F in FIG. 1. In addition, in the frame area F, as shown in FIG. 1, a bending portion B that is bendable, for example, into 180° (a U-shape) about a bending axis, which is the X-direction in the drawing, is provided between the display area D and the terminal section T so as to extend in one direction (X-direction in the drawing). Also, in the frame area F, in a second planarization film 23 (detailed later), as shown in FIG. 1, there is provided a trench G, generally C-shaped in a plan view, that runs through the second planarization film 23. Here, the trench G is shaped generally like a letter C in such a manner that the trench G is open on the terminal section T side in a plan view as shown in FIG. 1.

The organic EL display device 50a, as shown in FIGS. 9, 12, and 15, includes: the resin substrate layer 10; the TFT layer 30a provided on the resin substrate layer 10; an organic EL element layer 40 provided as a light-emitting element layer on the TFT layer 30a; and a sealing film 45 provided so as to cover the organic EL element layer 40.

The resin substrate layer 10, as shown in FIGS. 9 and 12 to 15, includes: a first resin substrate layer 6 provided opposite the TFT layer 30a; a second resin substrate layer 8 provided on the TFT layer 30a side; and an intermediate inorganic insulation film 7 provided between the first resin substrate layer 6 and the second resin substrate layer 8. Here, the first resin substrate layer 6 and the second resin substrate layer 8 are composed of, for example, polyimide resin. In addition, the intermediate inorganic insulation film 7, a base coat film 11, a gate insulation film 13, a first interlayer insulation film 15, a second interlayer insulation film 17, a third interlayer insulation film 18, and a fourth interlayer insulation film 21 (detailed later) include, for example, a monolayer inorganic insulation film of, for example, silicon nitride, silicon oxide, or silicon oxynitride or a stack of layers of any of these films. Note that on the surface on the TFT layer 30a side of the second resin substrate layer 8, as shown in FIG. 12, there are provided a plurality of concentric, annular inner slits Sa around the through hole H.

Figure 3:
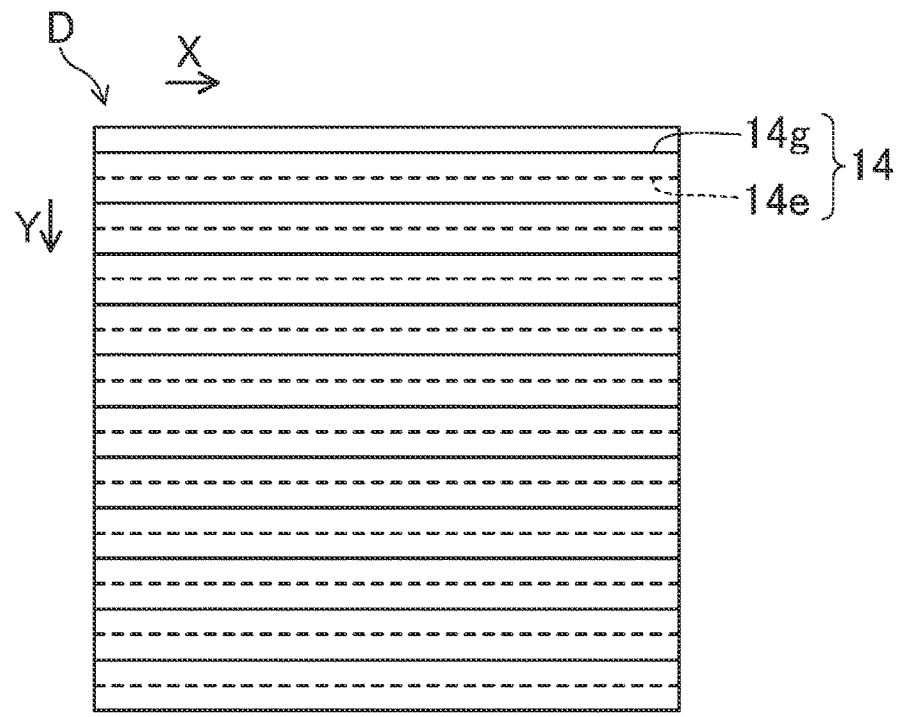
FIG. 3 is a plan view of a first wiring layer provided in the display area of the organic EL display device in accordance with the first embodiment of the present disclosure.
Figure 4:
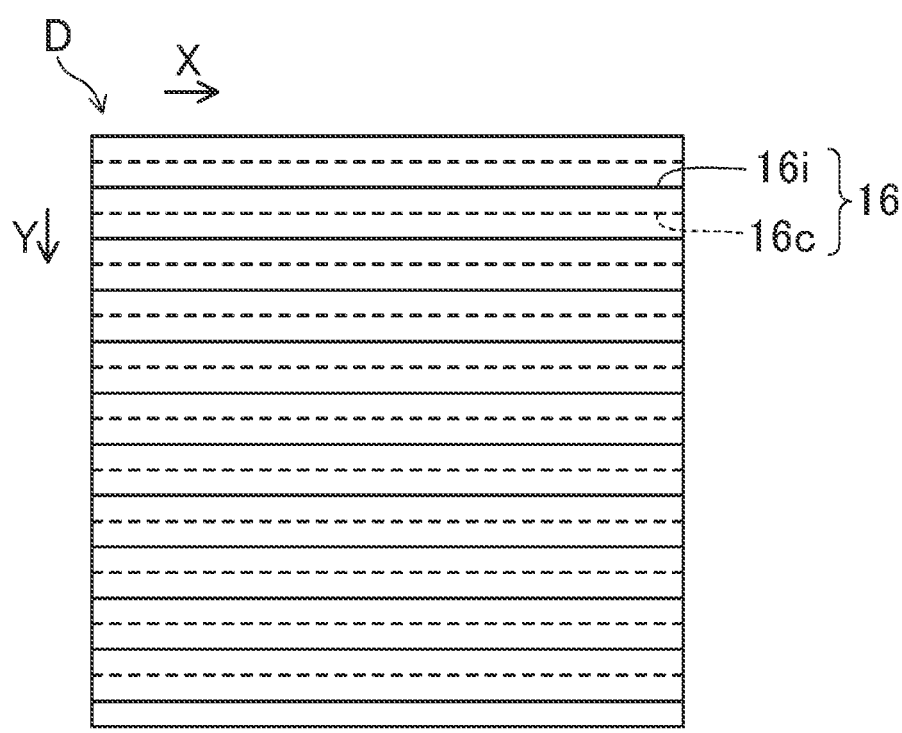
FIG. 4 is a plan view of a second wiring layer provided in the display area of the organic EL display device in accordance with the first embodiment of the present disclosure.

The TFT layer 30a, as shown in FIGS. 9, 12, and 15, includes an underlying inorganic insulation film, a first overlying inorganic insulation film (third interlayer insulation film 18), an underlying wiring layer (third wiring layer 19), an organic insulation film (first planarization film 20), a second overlying inorganic insulation film (fourth interlayer insulation film 21), an overlying wiring layer (fourth wiring layer 22), and the second planarization film 23, all of which are stacked on the resin substrate layer 10 in the stated order. Here, this underlying inorganic insulation film includes: the base coat film 11 provided on the resin substrate layer 10; the gate insulation film 13 provided on the base coat film 11 with a semiconductor layer 12a being interposed therebetween; the first interlayer insulation film 15 provided on the gate insulation film 13 with the first wiring layer 14 being interposed therebetween; and the second interlayer insulation film 17 provided on the first interlayer insulation film 15 with the second wiring layer 16 being interposed therebetween. In addition, the TFT layer 30a, as shown in FIGS. 7 and 8, includes, on the base coat film 11 and for each subpixel P, a first initialization TFT 9a, a threshold-voltage compensation TFT 9b, a write control TFT 9c, a drive TFT 9d, a power supply TFT 9e, a light-emission control TFT 9f, a second initialization TFT 9g, and a capacitor 9h. In addition, the TFT layer 30a, as shown in FIGS. 2 and 3, includes a plurality of gate lines 14g provided as the first wiring layer 14 so as to extend parallel to each other in the X-direction in the drawing in the display area D. Furthermore, the TFT layer 30a, as shown in FIGS. 2 and 3, includes a plurality of light-emission control lines 14e provided as the first wiring layer 14 so as to extend parallel to each other in the X-direction in the drawing in the display area D. Note that the light-emission control lines 14e are, as shown in FIGS. 2 and 3, disposed adjacent to the respective gate lines 14g. Additionally, the TFT layer 30a, as shown in FIGS. 2 and 4, includes a plurality of initialization power supply lines 16i provided as the second wiring layer 16 so as to extend parallel to each other in the X-direction in the drawing in the display area D. Furthermore, the TFT layer 30a, as shown in FIGS. 2 and 4, includes a plurality of third power supply lines 16c provided as the second wiring layer 16 so as to extend parallel to each other in the X-direction in the drawing in the display area D. Note that the third power supply lines 16c are, as shown in FIG. 4, disposed adjacent to the respective initialization power supply lines 16i. In addition, the TFT layer 30a, as shown in FIGS. 2 and 5, includes a plurality of source lines 19f provided as the third wiring layer 19 so as to extend parallel to each other in the Y-direction in the drawing in the display area D. Furthermore, the TFT layer 30a, as shown in FIGS. 2 and 5, includes a plurality of second power supply lines 19g provided as the third wiring layer 19 so as to extend parallel to each other in the Y-direction in the drawing in the display area D. Note that the second power supply lines 19g are, as shown in FIGS. 2 and 5, disposed adjacent to the respective source lines 19f. Furthermore, the plurality of second power supply lines 19g and the plurality of third power supply lines 16c are, as shown in FIG. 7, electrically connected via an eighth contact hole Hh formed through the second interlayer insulation film 17 in the respective subpixels P. In addition, the TFT layer 30a, as shown in FIG. 6, includes a first power supply line 22a provided as the fourth wiring layer 22 in a lattice so as to extend parallel to each other in both the X-direction and the Y-direction in the drawing. Note that the first power supply line 22a and the plurality of second power supply lines 19g are electrically connected via contact holes (not shown) formed through the first planarization film 20 in the respective subpixels P. Here, the first wiring layer 14, the second wiring layer 16, the third wiring layer 19, and the fourth wiring layer 22 include, for example, a metal monolayer film of, for example, molybdenum (Mo), titanium (Ti), aluminum (Al), copper (Cu), or tungsten (W) or a metal stack-layer film of, for example, Mo (top layer)-Al (middle layer)-Mo (bottom layer), Ti—Al—Ti, Al (top layer)-Ti (bottom layer), Cu—Mo, or Cu—Ti. Additionally, the first wiring layer 14 and the second wiring layer 16 are preferably made of the same material. In addition, the third wiring layer 19 and the fourth wiring layer 22 are preferably made of the same material. In addition, the semiconductor layer 12a includes, for example, a low-temperature polysilicon film or an In—Ga—Zn—O-based oxide semiconductor film. Additionally, the first planarization film 20, the second planarization film 23, and an edge cover 32 (detailed later) are made of, for example, an organic resin material such as polyimide resin.

The first initialization TFTs 9a, the threshold-voltage compensation TFTs 9b, the write control TFTs 9c, the drive TFTs 9d, the power supply TFTs 9e, the light-emission control TFTs 9f, and the second initialization TFTs 9g each include: a first terminal (see Na in FIG. 8) and a second terminal (see Nb in FIG. 8) both positioned so as to be separated from each other; and a control terminal for controlling conduction between the first terminal and the second terminal. Note that the first and second terminals of each TFT 9a to 9g are conductive regions of the semiconductor layer 12a.

The first initialization TFT 9a, as shown in FIG. 8, has, in each subpixel P, the control terminal thereof electrically connected to an associated one of the gate lines 14g, the first terminal thereof electrically connected to a gate electrode 14a of one of the capacitors 9h (detailed later), and the second terminal thereof electrically connected to an associated one of the initialization power supply lines 16i. Note that the control terminal of the first initialization TFT 9a is, as shown in FIG. 7, the two parts of the gate line 14g that overlap the semiconductor layer 12a. In addition, the first terminal of the first initialization TFT 9a is, as shown in FIGS. 7 and 9, electrically connected to the gate electrode 14a of the capacitor 9h via a third contact hole Hc formed through the gate insulation film 13, the first interlayer insulation film 15, the second interlayer insulation film 17, and the third interlayer insulation film 18, via a connection wiring line 19e, and via a first contact hole Ha formed through the first interlayer insulation film 15, the second interlayer insulation film 17, and the third interlayer insulation film 18. In addition, the second terminal of the first initialization TFT 9a is, as shown in FIG. 7, electrically connected to the initialization power supply line 16i via a fourth contact hole Hd formed through the gate insulation film 13, the first interlayer insulation film 15, the second interlayer insulation film 17, and the third interlayer insulation film 18, via a connection wiring line 19k, and via a fifth contact hole He formed through the second interlayer insulation film 17 and the third interlayer insulation film 18. Here, the first initialization TFT 9a is structured so as to initialize the voltage applied to the control terminal of the drive TFT 9d by applying the voltage on the initialization power supply line 16i to the capacitor 9h. Note that the first initialization TFT 9a is electrically connected to a gate line 14g(n−1) that is driven immediately prior to a gate line 14g(n) electrically connected to the control terminal of the threshold-voltage compensation TFT 9b and the control terminal of the write control TFT 9c.

The threshold-voltage compensation TFT 9b, as shown in FIG. 8, has, in each subpixel P, the control terminal thereof electrically connected to an associated one of the gate lines 14g, the first terminal thereof electrically connected to the second terminal of the drive TFT 9d, and the second terminal thereof electrically connected to the control terminal of the drive TFT 9d. Note that the control terminal of the threshold-voltage compensation TFT 9b is, as shown in FIG. 7, the two parts of the gate line 14g that overlap the semiconductor layer 12a. In addition, the first terminal of the threshold-voltage compensation TFT 9b is, as shown in FIG. 7, formed integral to the second terminal of the drive TFT 9d and electrically connected to the second terminal of the drive TFT 9d. In addition, the second terminal of the threshold-voltage compensation TFT 9b is, as shown in FIG. 7, electrically connected to the gate electrode 14a of the drive TFT 9d via the third contact hole Hc, the connection wiring line 19e, and the first contact hole Ha. Here, the threshold-voltage compensation TFT 9b is structured so as to compensate the threshold voltage of the drive TFT 9d by turning the drive TFT 9d into a diode-connected state in accordance with the selection of the gate line 14g.

The write control TFT 9c, as shown in FIG. 8, has, in each subpixel P, the control terminal thereof electrically connected to an associated one of the gate lines 14g, the first terminal thereof electrically connected to an associated one of the source lines 19f, and the second terminal thereof electrically connected to the first terminal of the drive TFT 9d. Note that the control terminal of the write control TFT 9c is, as shown in FIG. 7, a part of the gate line 14g that overlaps the semiconductor layer 12a. In addition, the first terminal of the write control TFT 9c is, as shown in FIG. 7, electrically connected to the source line 19f via a sixth contact hole Hf formed through the gate insulation film 13, the first interlayer insulation film 15, the second interlayer insulation film 17, and the third interlayer insulation film 18. In addition, the second terminal of the write control TFT 9c is, as shown in FIG. 7, formed integral to the first terminal of the drive TFT 9d and electrically connected to the first terminal of the drive TFT 9d. Here, the write control TFT 9c is structured so as to apply the voltage on the source line 19f to the first terminal of the drive TFT 9d in accordance with the selection of the gate line 14g.

The drive TFT 9d, as shown in FIG. 8, has, in each subpixel P, the control terminal thereof electrically connected to the first terminal of the first initialization TFT 9a and the second terminal of the threshold-voltage compensation TFT 9b, the first terminal thereof electrically connected to the second terminal of the write control TFT 9c and the second terminal of the power supply TFT 9e, and the second terminal thereof electrically connected to the first terminal of the threshold-voltage compensation TFT 9b and the first terminal of the light-emission control TFT 9f. Here, the drive TFT 9d is structured so as to control the amount of current of an organic EL element 35 by applying, to the first terminal of the light-emission control TFT 9f, a drive current that is in accordance with the voltage applied across the control terminal thereof and the first terminal thereof.

More specifically, the drive TFT 9d, as shown in FIGS. 7 and 9, includes the semiconductor layer 12a, the gate insulation film 13, the gate electrode (control terminal) 14a, the first interlayer insulation film 15, the second interlayer insulation film 17, and the third interlayer insulation film 18, all of which are provided on the base coat film 11 in the stated order. Here, the semiconductor layer 12a is, as shown in FIGS. 7 and 9, provided with bending on the base coat film 11. In addition, the semiconductor layer 12a includes: an intrinsic region provided so as to overlap the gate electrode 14a in a plan view; and a pair of conductive regions provided so as to sandwich the intrinsic region. Note that this intrinsic region, as shown in FIG. 7, has a middle portion thereof that is shaped generally like a letter V in a plan view. In addition, one of the conductive regions of the semiconductor layer 12a is provided as the first terminal, as shown in FIG. 7, formed integral to the second terminal of the write control TFT 9c and the second terminal of the power supply TFT 9e, and electrically connected to the second terminal of the write control TFT 9c and the second terminal of the power supply TFT 9e. In addition, the other conductive region of the semiconductor layer 12a is provided as the second terminal, as shown in FIG. 7, formed integral to the first terminal of the threshold-voltage compensation TFT 9b and the first terminal of the light-emission control TFT 9f, and electrically connected to the first terminal of the threshold-voltage compensation TFT 9b and the first terminal of the light-emission control TFT 9f. In addition, the gate insulation film 13 is, as shown in FIG. 9, provided so as to cover the semiconductor layer 12a. In addition, the gate electrode 14a is, as shown in FIGS. 7 and 9, provided on the gate insulation film 13 as the first wiring layer 14 in a rectangular insular manner in a plan view so as to overlap the intrinsic region of the semiconductor layer 12a. In addition, the first interlayer insulation film 15 is, as shown in FIG. 9, provided so as to cover the gate electrode 14a. In addition, the second interlayer insulation film 17 is, as shown in FIG. 9, provided on the first interlayer insulation film 15 with the third power supply line 16c being interposed therebetween. In addition, the third interlayer insulation film 18 is, as shown in FIG. 9, provided on the second interlayer insulation film 17.

The power supply TFT 9e, as shown in FIG. 8, has, in each subpixel P, the control terminal thereof electrically connected to an associated one of the light-emission control lines 14e, the first terminal thereof electrically connected to an associated one of the second power supply lines 19g, and the second terminal thereof electrically connected to the first terminal of the drive TFT 9d. Note that the control terminal of the power supply TFT 9e is, as shown in FIG. 7, a part of the light-emission control line 14e that overlaps the semiconductor layer 12a. In addition, the first terminal of the power supply TFT 9e is, as shown in FIG. 7, electrically connected to the second power supply line 19g via a second contact hole Hb formed through the gate insulation film 13, the first interlayer insulation film 15, the second interlayer insulation film 17, and the third interlayer insulation film 18. In addition, the second terminal of the power supply TFT 9e is, as shown in FIG. 7, formed integral to the first terminal of the drive TFT 9d and electrically connected to the first terminal of the drive TFT 9d. Here, the power supply TFT 9e is structured so as to apply the voltage on the second power supply line 19g to the first terminal of the drive TFT 9d in accordance with the selection of the light-emission control line 14e.

The light-emission control TFT 9f, as shown in FIG. 8, has, in each subpixel P, the control terminal thereof electrically connected to an associated one of the light-emission control lines 14e, the first terminal thereof electrically connected to the second terminal of the drive TFT 9d, and the second terminal thereof electrically connected to a first electrode 31 (detailed later) of the organic EL element 35. Note that the control terminal of the light-emission control TFT 9f is, as shown in FIG. 7, a part of the light-emission control line 14e that overlaps the semiconductor layer 12a. In addition, the first terminal of the light-emission control TFT 9f is, as shown in FIG. 7, formed integral to the second terminal of the drive TFT 9d and electrically connected to the second terminal of the drive TFT 9d. In addition, the second terminal of the light-emission control TFT 9f is, as shown in FIG. 7, electrically connected to the first electrode 31 of the organic EL element 35 via a seventh contact hole Hg formed through the gate insulation film 13, the first interlayer insulation film 15, the second interlayer insulation film 17, and the third interlayer insulation film 18 and via a connection wiring line 19j provided as the third wiring layer 19. Here, the light-emission control TFT 9f is structured so as to apply the aforementioned drive current to the organic EL element 35 in accordance with the selection of the light-emission control line 14e.

The second initialization TFT 9g, as shown in FIG. 8, has, in each subpixel P, the control terminal thereof electrically connected to an associated one of the gate lines 14g, the first terminal thereof electrically connected to the first electrode 31 of the organic EL element 35, and the second terminal thereof electrically connected to an associated one of the initialization power supply lines 16i. Note that the control terminal of the second initialization TFT 9g is, as shown in FIG. 7, a part of the gate line 14g that overlaps the semiconductor layer 12a. In addition, the first terminal of the second initialization TFT 9g is, as shown in FIG. 7, formed integral to the second terminal of the light-emission control TFT 9f and electrically connected to the first electrode 31 of the organic EL element 35. In addition, the second terminal of the second initialization TFT 9g is, as shown in FIG. 7, electrically connected to the initialization power supply line 16i via the fourth contact hole Hd, the connection wiring line 19k, and the fifth contact hole He. Here, the second initialization TFT 9g is structured so as to reset the electric charge stored in the first electrode 31 of the organic EL element 35 in accordance with the selection of the gate line 14g.

The capacitor 9h, as shown in FIGS. 7 and 9, includes: the gate electrode 14a; the first interlayer insulation film 15 provided on the gate electrode 14a; and the third power supply line 16c provided on the first interlayer insulation film 15 so as to overlap the gate electrode 14a in a plan view. In addition, the capacitor 9h, as shown in FIGS. 7 and 8, has, in each subpixel P: the gate electrode 14a thereof formed integral to the gate electrode 14a of the drive TFT 9d and electrically connected to the first terminal of the first initialization TFT 9a and the second terminal of the threshold-voltage compensation TFT 9b; and the third power supply line 16c electrically connected to an associated of the second power supply lines 19g via the eighth contact hole Hh formed through the second interlayer insulation film 17 and the third interlayer insulation film 18. Here, the capacitor 9h is structured so as to maintain the voltage on the gate electrode 14a of the drive TFT 9d when the associated one of the gate lines 14g is not selected, by storing charge under the voltage on an associated one of the source lines 19f when an associated one of the gate lines 14g is selected and maintaining that stored voltage. In addition, the third power supply line 16c is, as shown in FIG. 7, provided reaching the outside of the peripheral end of the gate electrode 14a along the entire peripheral end of the gate electrode 14a. In addition, the third power supply line 16c has, as shown in FIGS. 7 and 9, a through hole A that overlaps the gate electrode 14a in a plan view and that extends through the third power supply line 16c. In addition, on the third power supply line 16c, as shown in FIG. 9, the second interlayer insulation film 17 is provided so as to cover the third power supply line 16c. In addition, the gate electrode 14a is, as shown in FIGS. 7 and 9, electrically connected via the first contact hole Ha to the connection wiring line 19e provided as the third wiring layer 19.

The organic EL element layer 40 includes a matrix of organic EL elements 35 and as shown in FIG. 9, includes the first electrode 31, the organic EL layer 33, and a second electrode 34, all of which are stacked on the TFT layer 30a in the stated order.

A plurality of first electrodes 31 are, as shown in FIG. 9, provided in a matrix on the second planarization film 23 so as to correspond to the plurality of subpixels P. Here, the first electrode 31 is, in each subpixel P, electrically connected to the connection wiring line 19j via a contact hole (not shown) formed through the second planarization film 23, a connection wiring line (not shown) provided as the fourth wiring layer 22, and a contact hole (not shown) formed through the first planarization film 20. In addition, the first electrode 31 has a function of injecting holes to the organic EL layer 33. In addition, the first electrode 31 is more preferably made of a material that has a large work function in order to improve the efficiency of hole injection to the organic EL layer 33. Here, the first electrode 31 is made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). Alternatively, the first electrode 31 may be made of, for example, an alloy such as astatine-astatine oxide (At—AtO$_2$). Furthermore, the first electrode 31 may be made of, for example, an electrically conductive oxide such as tin oxide (SnO), zinc oxide (ZnO), indium tin oxide (ITO), or indium zinc oxide (IZO). In addition, the first electrode 31 may include a stack of layers of any of these materials. Note that examples of compound materials that have a large work function include indium tin oxide (ITO) and indium zinc oxide (IZO). In addition, the peripheral end portion of the first electrode 31 is covered with the lattice-shaped edge cover 32 (see FIG. 12) provided commonly to the plurality of subpixels P.

The organic EL layer 33, as shown in FIG. 9, includes: an individual functional layer disposed on each first electrode 31 and provided in a matrix so as to correspond to the plurality of subpixels P; and a common functional layer provided commonly to the plurality of subpixels P. Here, the organic EL layer 33, as shown in FIG. 10, includes a hole injection layer 1, a hole transport layer 2, an organic light-emitting layer 3, an electron transport layer 4, and an electron injection layer 5, all of which are provided on the first electrode 31 in the stated order. Note that in the present embodiment, the organic EL layer 33 in which the organic light-emitting layer 3 is provided as an individual functional layer, and the hole injection layer 1, the hole transport layer 2, the electron transport layer 4, and the electron injection layer 5 are provided as common functional layers is described as an example. However, through color conversion by means of, for example, a QLED (quantum-dot light-emitting diode), the organic light-emitting layer 3 may be used as a common functional layer, and at least one of the hole injection layer 1, the hole transport layer 2, the electron transport layer 4, and the electron injection layer 5 may be used as an individual functional layer.

The hole injection layer 1 is provided as a common functional layer that is alternatively referred to as the anode buffer layer, that has a function of bringing the energy levels of the first electrode 31 and the organic EL layer 33 closer to each other to improve the efficiency of hole injection from the first electrode 31 to the organic EL layer 33, and that is common to the plurality of subpixels P. Here, the hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styryl anthracene derivative, a fluorenone derivative, a hydrazone derivative, or a stilbene derivative.

The hole transport layer 2 has a function of improving the efficiency of hole transport from the first electrode 31 to the organic EL layer 33 and is provided as a common functional layer that is common to the plurality of subpixels P. Here, the hole transport layer 2 is made of, for example, a porphyrin derivative, an aromatic tertiary amine compound, a styryl amine derivative, polyvinyl carbazole, poly-p-phenylene vinylene, polysilane, a triazole derivative, an oxadiazole derivative, an imidazole derivative, a polyaryl alkane derivative, a pyrazoline derivative, a pyrazolone derivative, a phenylenediamine derivative, an aryl amine derivative, an amine-substituted chalcone derivative, an oxazole derivative, a styryl anthracene derivative, a fluorenone derivative, a hydrazone derivative, a stilbene derivative, hydrogenated amorphous silicon, hydrogenated amorphous silicon carbide, zinc sulfide, or zinc selenide.

The organic light-emitting layer 3 is injected with holes and electrons from the first electrode 31 and the second electrode 34 respectively when the organic light-emitting layer 3 is under voltage applied by the first electrode 31 and the second electrode 34. These holes and electrons recombine in the organic light-emitting layer 3. Here, the organic light-emitting layer 3 is made of a material that has a high luminous efficiency. Then, the organic light-emitting layer 3 is made of, for example, a metal oxinoid compound (8-hydroxy quinoline metal complex), a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styryl amine derivative, a bis(styryl)benzene derivative, a tris(styryl)benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylene vinylene, or polysilane.

The electron transport layer 4 is provided as a common functional layer that has a function of efficiently transporting electrons to the organic light-emitting layer 3 and that is common to the plurality of subpixels P. Here, the electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 34 and the organic EL layer 33 closer to each other to improve the efficiency of electron injection from the second electrode 34 to the organic EL layer 33. This function can lower the drive voltage of the organic EL element 35. Note that the electron injection layer 5 is alternatively referred to as the cathode buffer layer and provided as a common functional layer that is common to the plurality of subpixels P. Here, the electron injection layer 5 is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 34 is, as shown in FIG. 9, provided so as to cover the organic EL layers 33 and the edge cover 32 commonly to the plurality of subpixels P. In addition, the second electrode 34 has a function of injecting electrons to the organic EL layers 33. In addition, the second electrode 34 is more preferably made of a material that has a small work function in order to improve the efficiency of electron injection to the organic EL layers 33. Here, the second electrode 34 is made of, for example, silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), or lithium fluoride (LiF). In addition, the second electrode 34 may be made of, for example, a magnesium-copper (Mg—Cu) alloy, a magnesium-silver (Mg—Ag) alloy, a sodium-potassium (Na—K) alloy, an astatine-astatine oxide (At—$AtO_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. In addition, the second electrode 34 may be made of, for example, an electrically conductive oxide such as tin oxide (SnO), zinc oxide (ZnO), indium tin oxide (ITO), or indium zinc oxide (IZO). In addition, the second electrode 34 may include a stack of layers of any of these materials. Note that examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

The sealing film 45 is, as shown in FIGS. 9, 12, and 15, provided so as to cover the second electrode 34, includes a first inorganic sealing film 41, an organic sealing film 42, and a second inorganic sealing film 43, all of which are stacked on the second electrode 34 in the stated order, and has a function of protecting the organic EL layer 33 in each organic EL element 35 from, for example, water and oxygen. Here, the first inorganic sealing film 41 and the second inorganic sealing film 43 include, for example, an inorganic insulation film such as a silicon nitride film, a silicon oxide film, or a silicon oxynitride film. In addition, the organic sealing film 42 is made of, for example, an organic resin material such as acrylic resin, epoxy resin, silicone resin, polyurea resin, parylene resin, polyimide resin, or polyamide resin.

In addition, the organic EL display device 50a, as shown in FIG. 1, includes, in the frame area F: a first outer damming wall Wa provided like a frame surrounding the display area D outside the trench G; and a second outer damming wall Wb provided like a frame around the first outer damming wall Wa.

The first outer damming wall Wa, as shown in FIG. 15, includes: a lower resin layer 23c made of the same material and in the same layer as the second planarization film 23; and an upper resin layer 32c provided on the lower resin layer 23c via a connection wiring line 31b and made of the same material and in the same layer as the edge cover 32. Here, the connection wiring line 31b is made of the same material and in the same layer as the first electrode. Note that the first outer damming wall Wa is provided so as to overlap an outer peripheral portion of the organic sealing film 42 in the sealing film 45 and structured so as to restrain ink that will form the organic sealing film 42 from spreading.

The second outer damming wall Wb, as shown in FIG. 15, includes: a lower resin layer 23*d* made of the same material and in the same layer as the second planarization film 23; and an upper resin layer 32*d* provided on the lower resin layer 23*d* via the connection wiring line 31*b* and made of the same material and in the same layer as the edge cover 32.

In addition, the organic EL display device 50*a*, as shown in FIG. 1, includes, in the frame area F, a first frame line 19*h* provided inside the trench G like a frame as the third wiring layer 19 in such a manner that both end regions of the opening of the trench G reach the terminal section T. Here, the first frame line 19*h* is structured so as to be fed with a high-voltage power supply (ELVDD) through the terminal section T.

In addition, the organic EL display device 50*a*, as shown in FIG. 1, includes, in the frame area F, a second frame line 19*i* provided generally like a C outside the trench G as the third wiring layer 19 and having two end regions reaching the terminal section T. Here, the second frame line 19*i* is, as shown in FIG. 15, structured so as to be electrically connected to the second electrode 34 via the connection wiring line 31*b* provided in the trench G and to be fed with a low-voltage power supply (ELVSS) through the terminal section T.

In addition, the organic EL display device 50*a*, as shown in FIG. 11, includes, in the non-display area N, a plurality of concentric, annular inner protrusions C around the through hole H.

Each inner protrusion C, as shown in FIG. 12, includes: an underlying resin layer 8*a* including the second resin substrate layer 8 in the resin substrate layer 10; and a first underlying inorganic insulation layer 11*a*, a second underlying inorganic insulation layer 13*a*, a third underlying inorganic insulation layer 15*a*, and a fourth underlying inorganic insulation layer 17*a* that are provided on the underlying resin layer 8*a* and that are made of the same material and in the same layer as the base coat film 11, the gate insulation film 13, the first interlayer insulation film 15, and the second interlayer insulation film 17.

The underlying resin layer 8*a* is, as shown in FIG. 12, separated by the plurality of concentric, annular inner slits Sa provided around the through hole H on the surface on the base coat film 11 side of the second resin substrate layer 8. Here, in one of the plurality of inner slits Sa that is the closest to an inner damming wall Wc (detailed later), as shown in FIG. 12, there is provided an eave portion L in which the base coat film 11, the gate insulation film 13, the first interlayer insulation film 15, and the second interlayer insulation film 17 are provided projecting from the display area D side to the through hole H side. Note that the eave portion L, which includes the base coat film 11, the gate insulation film 13, the first interlayer insulation film 15, and the second interlayer insulation film 17 is, as shown in FIG. 12, in contact with the first inorganic sealing film 41 via the third interlayer insulation film 18. In addition, the underlying resin layer 8*a* is, as shown in FIG. 12, in contact with the first inorganic sealing film 41 via the third interlayer insulation film 18. Because of these, it is possible to ensure sealing capability by the sealing film 45 in the non-display area N in which the through hole H is provided.

The first underlying inorganic insulation layer 11*a*, the second underlying inorganic insulation layer 13*a*, the third underlying inorganic insulation layer 15*a*, and the fourth underlying inorganic insulation layer 17*a* are, as shown in FIG. 12, provided so as to project like an eave from the underlying resin layer 8*a* to the through hole H side and the display area D side. Note that although in the present embodiment, a structure in which the first underlying inorganic insulation layer 11*a*, the second underlying inorganic insulation layer 13*a*, the third underlying inorganic insulation layer 15*a*, and the fourth underlying inorganic insulation layer 17*a* project like an eave from the underlying resin layer 8*a* to both the through hole H side and the display area D side is described as an example, the first underlying inorganic insulation layer 11*a*, the second underlying inorganic insulation layer 13*a*, the third underlying inorganic insulation layer 15*a*, and the fourth underlying inorganic insulation layer 17*a* may project like an eave from the underlying resin layer 8*a* to either the through hole H side or the display area D side.

In addition, the organic EL display device 50*a*, as shown in FIGS. 11 and 12, includes, in the non-display area N, the inner damming wall Wc provided around the plurality of inner protrusions C so as to overlap am inner peripheral end portion of the organic sealing film 42.

The inner damming wall Wc, as shown in FIG. 12, includes: a lower resin layer 23*a* made of the same material and in the same layer as the second planarization film 23; and an upper resin layer 32*a* provided on the lower resin layer 23*a* via the second electrode 34 and made of the same material and in the same layer as the edge cover 32.

In addition, the organic EL display device 50*a*, as shown in FIGS. 11 and 12, includes, in the non-display area N, the annular outer protrusion Wd provided around the inner damming wall Wc on the display area side of the inner damming wall Wc.

The outer protrusion Wd, as shown in FIG. 12, includes: an overlying resin layer 20*a* made of the same material and in the same layer as the first planarization film 20; an overlying inorganic insulation layer 21*a* provided on the overlying resin layer 20*a* and made of the same material and in the same layer as the fourth interlayer insulation film 21; and a metal layer 22*b* provided on the overlying inorganic insulation layer 21*a* and made of the same material and in the same layer as the first power supply line 22*a*.

The overlying resin layer 20*a* is, as shown in FIG. 12, in contact with the organic sealing film 42 via the first inorganic sealing film 41.

The overlying inorganic insulation layer 21*a* and the metal layer 22*b* are, as shown in FIG. 12, provided so as to project like an eave from the overlying resin layer 20*a* to the inner damming wall Wc side and the display area D side. Note that although in the present embodiment, a structure in which the overlying inorganic insulation layer 21*a* and the metal layer 22*b* project like an eave from the overlying resin layer 20*a* to both the inner damming wall Wc side and the display area D side is described as an example, the overlying inorganic insulation layer 21*a* and the metal layer 22*b* may project like an eave from the overlying resin layer 20*a* to either the inner damming wall Wc side or the display area D side. In addition, the overlying inorganic insulation layer 21*a* and the metal layer 22*b*, both provided on the overlying resin layer 20*a* in the outer protrusion Wd, may have a single-layered structure including either the overlying inorganic insulation layer 21*a* or the metal layer 22*b*.

In addition, although in the present embodiment, the outer protrusion Wd, which includes the first power supply line 22*a* provided as an overlying wiring layer and further includes the overlying resin layer 20*a*, the overlying inorganic insulation layer 21*a*, and the metal layer 22*b*, is described as an example, the outer protrusion Wd may include the first electrode 31 provided as an overlying wiring layer and be structured as shown in FIG. 13. Specifically, as shown in FIG. 13, the outer protrusion Wd, as shown in FIG.

13, includes: an overlying resin layer 23b made of the same material and in the same layer as the second planarization film 23; and a metal layer 31a provided on the overlying resin layer 23b and made of the same material and in the same layer as the first electrode 31. Here, the overlying resin layer 23b is, as shown in FIG. 13, in contact with the organic sealing film 42 via the first inorganic sealing film 41. In addition, the metal layer 31a may, as shown in FIG. 13, be provided so as to project like an eave from the overlying resin layer 23b to the inner damming wall We side and the display area D side.

In addition, the outer protrusion Wd may be structured as shown in FIG. 14. Specifically, as shown in FIG. 14, the outer protrusion Wd, as shown in FIG. 14, includes: an overlying resin layer J; and a metal layer 19m provided on the overlying resin layer J and provided as the third wiring layer 19. Here, the overlying resin layer J is made of the same material and in the same layer as an injection layer formed in a slit in the bending portion B (detailed later). In addition, the metal layer 19m is, as shown in FIG. 14, provided so as to project like an eave from the overlying resin layer J to the inner damming wall We side and the display area D side. According to this variation example, even in a structure in which the fourth interlayer insulation film 21, the fourth wiring layer 22, and the second planarization film 23 are omitted, it is possible to form the outer protrusion Wd.

Note that although in the present embodiment, a structure in which the metal layer 31a projects like an eave from the overlying resin layer 23b to both the inner damming wall We side and the display area D side is described as an example, the metal layer 31a may project like an eave from the overlying resin layer 23b to either the inner damming wall We side or the display area D side.

As described in the foregoing, since in the organic EL display device 50a, as shown in FIG. 12, in the non-display area N, upper parts of the inner protrusions C and the outer protrusion Wd are formed like an eave to have a reverse-tapered structure, the common functional layers (the hole injection layer 1, the hole transport layer 2, the electron transport layer 4, and the electron injection layer 5) and the common second electrode 34 are formed separately in the display area D side and in the through hole H side by the inner protrusions C and the outer protrusion Wd. Note that although in FIG. 12, the hole injection layer 1, the hole transport layer 2, the electron transport layer 4, and the electron injection layer 5 are not shown, the common functional layers including the hole injection layer 1, the hole transport layer 2, the electron transport layer 4, and the electron injection layer 5 are formed separately along the inner protrusions C and along the outer protrusion Wd similarly to the second electrode 34. Here, the reverse-tapered structure can be formed by subjecting resin layers such as the overlying resin layer 20a, the overlying resin layer 23b, and the overlying resin layer J to side etching by anisotropic etching involving dry ashing by using, for example, an oxygen gas and using inorganic films such as the overlying inorganic insulation layer 21a, the metal layer 22b, the metal layer 31a, and the metal layer 19m as a mask. In addition, although the step of forming the reverse-tapered structure, as will be described later in detail, can be performed in the course of a TFT layer forming step, for example, a resist pattern that exposes only a portion where the reverse-tapered structure is to be formed may be formed after the formation of an etch cover in an organic EL element layer forming step, the parts other than the reverse-tapered structure be protected in dry ashing, and the resist pattern be removed after the dry ashing, in order to stably form the reverse-tapered structure.

In addition, the organic EL display device 50a, as shown in FIG. 16, includes, in the bending portion B: an injection layer Jb provided so as to fill in a linear slit Sb formed in the base coat film 11, the gate insulation film 13, the first interlayer insulation film 15, the second interlayer insulation film 17, and the third interlayer insulation film 18; a plurality of routing lines 19n provided on the injection layer Jb and the third interlayer insulation film 18; and a wiring cover layer 20b provided so as to cover the routing lines 19n.

The linear slit Sb, as shown in FIG. 16, is provided like a groove passing all the way through in the direction in which the bending portion B extends, so as to run through the base coat film 11, the gate insulation film 13, the first interlayer insulation film 15, the second interlayer insulation film 17, and the third interlayer insulation film 18 and to expose the top face of the resin substrate layer 10a.

The injection layer Jb is made of, for example, an organic resin material such as polyimide resin.

The plurality of routing lines 19n are provided so as to extend parallel to each other in the direction perpendicular to the direction in which the bending portion B extends. Here, the end regions of each routing line 19n are, as shown in FIG. 16, electrically connected respectively to a first gate conductive layer 14na and a second gate conductive layer 14nb via contact holes formed through a stack of the first interlayer insulation film 15, the second interlayer insulation film 17, and the third interlayer insulation film 18. Note that the routing lines 19n are provided as the third wiring layer 19. In addition, the first gate conductive layer 14na is provided as the first wiring layer 14 and electrically connected to display wiring (e.g., the source lines 19f) disposed in the display area D. In addition, the second gate conductive layer 14nb is provided as the first wiring layer 14 and electrically connected to a terminal of the terminal section T. In addition, the wiring cover layer 20b is made of the same material and in the same layer as the first planarization film 20.

In the organic EL display device 50a having the structure described above, in each subpixel P, first, when an associated one of the light-emission control lines 14e is selected and deactivated, the organic EL element 35 stops emitting light. In this non-light-emitting state, by selecting an associated one of the gate lines 14g (one of the gate lines 14g that is electrically connected to the first initialization TFT 9a and the second initialization TFT 9g) and feeding a gate signal to the first initialization TFT 9a via that gate line 14g, the first initialization TFT 9a and the second initialization TFT 9g are turned on, and the voltage on an associated one of the initialization power supply lines 16i is fed to the capacitor 9h, as well as the drive TFT 9d is turned on. Hence, the electric charge in the capacitor 9h is discharged, and the voltage on the control terminal (first gate electrode) 14a of the drive TFT 9d is initialized. Next, by selecting and activating an associated one of the gate lines 14g (one of the gate lines 14g that is electrically connected to the threshold-voltage compensation TFT 9b and the write control TFT 9c), the threshold-voltage compensation TFT 9b and the write control TFT 9c are turned on, and a prescribed voltage associated with a source signal transmitted via an associated one of the source lines 19f is written to the capacitor 9h via the drive TFT 9d in diode-connected state, as well as an initialization signal is applied to the first electrode 31 of the organic EL element 35 via an associated one of the initialization power supply lines 16i, and the electric charge stored in the first electrode 31 is reset. Thereafter, an associated one of the light-emission control lines 14e is selected, the power supply TFT 9e and the light-emission control TFT 9f are turned on, and a drive current that is in accordance with the voltage on the control terminal (gate electrode) 16a of the drive TFT 9d is fed from an associated one of the second power supply lines 19g to the organic EL element 35. In this manner, in the organic EL display device 50a, in each subpixel P, the organic EL element 35 emits light with a luminance in accordance with drive current, to produce an image display.

A description is given next of a method of manufacturing the organic EL display device 50a in accordance with the present embodiment. Note that the method of manufacturing the organic EL display device 50a in accordance with the present embodiment includes a TFT layer forming step, an organic EL element layer forming step, a sealing film forming step, and a through hole forming step.

TFT Layer Forming Step

First, for example, after coating a glass substrate with a non-photosensitive polyimide resin (having a thickness of approximately 2 μm), this coating film is subjected to pre-baking and post-baking, to form the first resin substrate layer 6.

Subsequently, an inorganic insulation film (having a thickness of approximately 1,000 nm) such as a silicon oxide film is formed by, for example, plasma CVD (chemical vapor deposition) across the entire substrate on which the first resin substrate layer 6 has been formed, to form the intermediate inorganic insulation film 7.

Furthermore, after coating the entire substrate on which the intermediate inorganic insulation film 7 has been formed with, for example, a non-photosensitive polyimide resin (having a thickness of approximately 2 μm), this coating film is subjected to pre-baking and post-baking, to form the second resin substrate layer 8 to form the resin substrate layer 10.

Thereafter, an inorganic insulation film (having a thickness of approximately 1,000 nm) such as a silicon oxide film is formed by, for example, plasma CVD across the entire substrate on which the resin substrate layer 10 has been formed, to form the base coat film 11.

Subsequently, after forming, for example, an amorphous silicon film (having a thickness of approximately 50 nm) by plasma CVD across the entire substrate on which the base coat film 11 has been formed and crystallizing the amorphous silicon film by, for example, laser annealing, thereby forming a semiconductor film of a polysilicon film, the semiconductor film is patterned to form the semiconductor layer 12a.

Thereafter, an inorganic insulation film (approximately 100 nm) such as a silicon oxide film is formed by, for example, plasma CVD across the entire substrate on which the semiconductor layer 12a has been formed, to form the gate insulation film 13 so as to cover the semiconductor layer 12a.

Furthermore, after forming, for example, an aluminum film (having a thickness of approximately 350 nm) and a molybdenum nitride film (having a thickness of approximately 50 nm) in the stated order by, for example, sputtering across the entire substrate on which the gate insulation film 13 has been formed, these metal stack-layer films are patterned, to form the first wiring layer 14 such as the gate lines 14g.

Subsequently, the semiconductor layer 12a is doped with impurity ions using the first wiring layer 14 as a mask, to form intrinsic regions and conductive regions in the semiconductor layer 12a.

Thereafter, an inorganic insulation film (having a thickness of approximately 100 nm) such as a silicon oxide film is formed by, for example, plasma CVD across the entire substrate on which the semiconductor layer 12a having intrinsic regions and conductive regions has been formed, to form the first interlayer insulation film 15.

Subsequently, after forming, for example, an aluminum film (having a thickness of approximately 350 nm) and a molybdenum nitride film (having a thickness of approximately 50 nm) in the stated order by, for example, sputtering across the entire substrate on which the first interlayer insulation film 15 has been formed, these metal stack-layer films are patterned, to form the second wiring layer 16 such as the third power supply lines 16c.

Furthermore, an inorganic insulation film (having a thickness of approximately 500 nm) such as a silicon oxide film is formed by, for example, plasma CVD across the entire substrate on which the second wiring layer 16 has been formed, to form the second interlayer insulation film 17.

Thereafter, the gate insulation film 13, the first interlayer insulation film 15, and the second interlayer insulation film 17 are patterned to form, for example, the contact hole Ha.

Furthermore, in the bending portion B, the base coat film 11, the gate insulation film 13, the first interlayer insulation film 15, and the second interlayer insulation film 17 are removed to form the linear slit Sb in the base coat film 11, the gate insulation film 13, the first interlayer insulation film 15, and the second interlayer insulation film 17, as well as in the non-display area N, the base coat film 11, the gate insulation film 13, the first interlayer insulation film 15, and the second interlayer insulation film 17 are partially removed.

Thereafter, the second resin substrate layer 8 exposed from the base coat film 11, the gate insulation film 13, the first interlayer insulation film 15, and the second interlayer insulation film 17 is subjected to ashing, to form the inner slits Sa.

Subsequently, after forming an inorganic insulation film (having a thickness of approximately 500 nm) such as a silicon oxide film by, for example, plasma CVD across the entire substrate on which the inner slits Sa have been formed, this inorganic insulation film is patterned, to form the third interlayer insulation film 18.

Furthermore, after coating the entire substrate on which the third interlayer insulation film 18 has been formed with, for example, a photosensitive polyimide resin, this coating film is subjected to pre-baking, exposure, development, and post-baking, to form the injection layer Jb inside the linear slit Sb of the bending portion B, as well as to temporarily form an injection layer inside the inner slits Sa.

Subsequently, after forming, for example, a titanium film (having a thickness of approximately 30 nm), an aluminum film (having a thickness of approximately 300 nm), and a titanium film (having a thickness of approximately 50 nm) in the stated order by, for example, sputtering across the entire substrate on which the injection layer has been formed, these metal stack-layer films are patterned, to form the third wiring layer 19 such as the source lines 19f.

Furthermore, after coating the entire substrate on which the third wiring layer 19 has been formed with a photosensitive polyimide resin (having a thickness of approximately 2 μm) by, for example, spin-coating or slit-coating, this coating film is subjected to pre-baking, exposure, development, and post-baking, to form, for example, the first planarization film 20.

Thereafter, after forming an inorganic insulation film (having a thickness of approximately 500 nm) such as a silicon oxide film by, for example, plasma CVD across the entire substrate on which, for example, the first planarization film 20 has been formed, this inorganic insulation film is patterned, to form, for example, the fourth interlayer insulation film 21.

Subsequently, after forming, for example, a titanium film (having a thickness of approximately 30 nm), an aluminum film (having a thickness of approximately 300 nm), and a titanium film (having a thickness of approximately 50 nm) in the stated order by, for example, sputtering across the entire substrate on which, for example, the fourth interlayer insulation film 21 has been formed, these metal stack-layer films are patterned, to form the fourth wiring layer 22 such as the first power supply line 22a.

Thereafter, in the non-display area N, the first planarization film 20 exposed from the metal layer 22b in the fourth wiring layer 22 is subjected to ashing, to form the overlying resin layer 20a to form the outer protrusion Wd.

Finally, after coating the entire substrate on which the outer protrusion Wd has been formed with a polyimide-based photosensitive resin film (having a thickness of approximately 2 μm) by, for example, spin-coating or slit-coating, this coating film is subjected to pre-baking, exposure, development, and post-baking, to form the second planarization film 23.

The TFT layer 30a can be fabricated as described in the foregoing.

Organic EL Element Layer Forming Step

The first electrode 31, the edge cover 32, the organic EL layer 33 (the hole injection layer 1, the hole transport layer 2, the organic light-emitting layer 3, the electron transport layer 4, and the electron injection layer 5), and the second electrode 34 are formed by a well-known technique on the second planarization film 23 in the TFT layer 30a formed in the TFT layer forming step above, to form the organic EL element layer 40. Here, when the hole injection layer 1, the hole transport layer 2, the electron transport layer 4, the electron injection layer 5, and the second electrode 34 are formed by vapor deposition, the hole injection layer 1, the hole transport layer 2, the electron transport layer 4, the electron injection layer 5, and the second electrode 34 are formed separately along the inner protrusions C and along the outer protrusion Wd by steps. Note that after the edge cover 32 is formed, the injection layer temporarily formed inside the inner slits Sa is removed by ashing.

Sealing Film Forming Step

On the organic EL element layer 40 formed by the organic EL element layer forming step described above, the sealing film 45 (the first inorganic sealing film 41, the organic sealing film 42, and the second inorganic sealing film 43) is formed by a well-known technique. Thereafter, after attaching a protection sheet (not shown) to the surface of the substrate on which the sealing film 45 has been formed, the glass substrate is detached from the bottom face of the resin substrate layer 10 by projecting a laser beam from the glass substrate side of the resin substrate layer 10, and furthermore, a protection sheet (not shown) is attached to the bottom face of the resin substrate layer 10 from which the glass substrate has been detached.

Through Hole Forming Step

In the non-display area N of the resin substrate layer 10 from which the glass substrate has been detached in the sealing film forming step described above, the through hole H is formed by, for example, projecting and annularly scanning a laser beam. Thereafter, the electronic component 60 is installed in such a manner that the electronic component 60 such as a camera is located on the backside of the through hole H when the organic EL display device 50a through which the through hole H has been formed is fixed, for example, to the interior of the housing.

The organic EL display device 50a in accordance with the present embodiment can be manufactured as described in the foregoing.

As described above, according to the organic EL display device 50a in accordance with the present embodiment, the plurality of inner protrusions C are concentrically and annularly provided around the through hole H in the non-display area N of the display area D. Here, each inner protrusion C includes: the underlying resin layer 8a separated by the inner slits Sa concentrically and annularly formed on the surface of the resin substrate layer 10 around the through hole H, and the first underlying inorganic insulation layer 11a, the second underlying inorganic insulation layer 13a, the third underlying inorganic insulation layer 15a, and the fourth underlying inorganic insulation layer 17a provided on the underlying resin layer 8a. Then, the first underlying inorganic insulation layer 11a, the second underlying inorganic insulation layer 13a, the third underlying inorganic insulation layer 15a, and the fourth underlying inorganic insulation layer 17a are provided so as to project like an eave from the underlying resin layer 8a to the through hole H side and the display area D side. Therefore, the common functional layers (the hole injection layer 1, the hole transport layer 2, the electron transport layer 4, and the electron injection layer 5) and the common second electrode 34 are, in each inner protrusion C, formed separately in the display area D side and in the through hole H side. Hence, the common functional layers (the hole injection layer 1, the hole transport layer 2, the electron transport layer 4, and the electron injection layer 5) and the common second electrode 34 can be formed separately in the display area D side and in the through hole H side without having to use a negative photosensitive material. Therefore, it is possible to form the common functional layers (the hole injection layer 1, the hole transport layer 2, the electron transport layer 4, and the electron injection layer 5) and the common second electrode 34 separately in the display area D side and in the through hole H side at low cost.

In addition, according to the organic EL display device 50a in accordance with the present embodiment, in the non-display area N, the outer protrusion Wd is annularly provided on the display area D side of the inner damming wall Wc. Here, the outer protrusion Wd includes: the overlying resin layer 20a made of the same material and in the same layer as the first planarization film 20; the overlying inorganic insulation layer 21a provided on the overlying resin layer 20a and made of the same material and in the same layer as the fourth interlayer insulation film 21; and the metal layer 22b provided on the overlying inorganic insulation layer 21a and made of the same material and in the same layer as the first power supply line 22a. Then, the overlying inorganic insulation layer 21a and the metal layer 22b are provided so as to project like an eave from the overlying resin layer 20a to the inner damming wall Wc side and the display area D side. Therefore, the common functional layers (the hole injection layer 1, the hole transport layer 2, the electron transport layer 4, and the electron injection layer 5) and the common second electrode 34 are, in the outer protrusion Wd, formed separately in the display area D side and in the through hole H side. Hence, the common functional layers (the hole injection layer 1, the hole transport layer 2, the electron transport layer 4, and the electron injection layer 5) and the common second electrode 34 can be formed separately in the display area D side and in the through hole H side without having to use a negative photosensitive material. Therefore, it is possible to form the common functional layers (the hole injection layer 1, the hole transport layer 2, the electron transport layer 4, and the electron injection layer 5) and the common second electrode 34 separately in the display area D side and in the through hole H side at low cost.

In addition, according to the organic EL display device 50a in accordance with the present embodiment, in one of the plurality of inner slits Sa that is the closest to the inner damming wall Wc side, the eave portion L, in which the base coat film 11, the gate insulation film 13, the first interlayer insulation film 15, and the second interlayer insulation film 17 are provided projecting from the display area D side to the through hole H side, is provided. Here, the eave portion L, which includes the base coat film 11, the gate insulation film 13, the first interlayer insulation film 15, and the second interlayer insulation film 17, is in contact with the first inorganic sealing film 41 via the third interlayer insulation film 18. Hence, for example, the water content M contained in the second resin substrate layer 8 is blocked by the third interlayer insulation film 18, as well as the base coat film 11, the gate insulation film 13, the first interlayer insulation film 15, and the second interlayer insulation film 17 in the TFT layer 30a are in contact with the first inorganic sealing film 41 in the sealing film 45. Therefore, it is possible to ensure sealing capability by the sealing film 45 in the non-display area N, and it is possible to restrain the organic EL element 35 from deterioration.

OTHER EMBODIMENTS

Although in each embodiment above, an organic EL layer that has a five-layered structure including a hole injection layer, a hole transport layer, a light-emitting layer, an electron transport layer, and an electron injection layer was described as an example, the organic EL layer may have, for example, a three-layered structure including a hole injection and transport layer, a light-emitting layer, and an electron transport and injection layer.

In addition, although in each embodiment above, an organic EL display device including a first electrode as an anode and a second electrode as a cathode was described as an example, the present disclosure is equally applicable to organic EL display devices in which the layered structure of the organic EL layer is reversed, so that a first electrode is a cathode and a second electrode is an anode.

In addition, although in each embodiment above, an organic EL display device was described as an example of the display device, the present disclosure is applicable to display devices including a plurality of current-driven light-emitting elements, for instance, display devices including QLEDs that are light-emitting elements using a quantum-dot layer.

INDUSTRIAL APPLICABILITY

As described above, the present disclosure is useful in flexible display devices.

REFERENCE SIGNS LIST

B Bending Portion
C Inner Protrusion
D Display Area
F Frame Area
H Through Hole
Jb Injection Layer
J Overlying Resin Layer
L Eave Portion
P Subpixel
Sa Inner Slit
Sb Linear Slit
T Terminal Section
Wa First Outer Damming Wall
Wc Inner Damming Wall
Wd Outer Protrusion
6 First Resin Substrate Layer
7 Intermediate Inorganic Insulation Film
8 Second Resin Substrate Layer
8a Underlying Resin Layer
10 Resin Substrate Layer
11 Base Coat Film (Underlying Inorganic Insulation Film)
11a First Underlying Inorganic Insulation Layer (Underlying Inorganic Insulation Layer)
13 Gate Insulation Film (Underlying Inorganic Insulation Film)
13a Second Underlying Inorganic Insulation Layer (Underlying Inorganic Insulation Layer)
15 First Interlayer Insulation Film (Underlying Inorganic Insulation Film)
15a Third Underlying Inorganic Insulation Layer (Underlying Inorganic Insulation Layer)
17 Second Interlayer Insulation Film (Underlying Inorganic Insulation Film)
17a Fourth Underlying Inorganic Insulation Layer (Underlying Inorganic Insulation Layer)
18 Third Interlayer Insulation Film (First Overlying Inorganic Insulation Film)
19 Third Wiring Layer (Underlying Wiring Layer)
19m Metal Layer
19n Routing Line
20 First Planarization Film (Organic Insulation Film)
20a Overlying Resin Layer
21 Fourth Interlayer Insulation Film (Second Overlying Inorganic Insulation Film)
21a Overlying Inorganic Insulation Layer
22 Fourth Wiring Layer (Overlying Wiring Layer)
22a First Power Supply Line
22b Metal Layer
30a TFT Layer (Thin Film Transistor Layer)
31 First Electrode (Overlying Wiring Layer)
31a Metal Layer
33 Organic EL Layer (Organic Electroluminescence Layer, Functional Layer)
34 Second Electrode
40 Organic EL Element Layer (Light-emitting Element Layer)
41 First Inorganic Sealing Film
42 Organic Sealing Film
43 Second Inorganic Sealing Film
45 Sealing Film 50a Organic EL Display Device
60 Electronic Component

The invention claimed is:

1. A display device comprising:
a resin substrate layer;
a thin film transistor layer provided on the resin substrate layer and including an underlying inorganic insulation film, an underlying wiring layer, and an organic insulation film, all of which are stacked in a stated order;
a light-emitting element layer provided on the thin film transistor layer and including a plurality of first electrodes, a common functional layer, and a second electrode that is common, all of which are stacked in a stated order, correspondingly to a plurality of subpixels included in a display area;
a sealing film provided so as to cover the light-emitting element layer and including a first inorganic sealing film, an organic sealing film, and a second inorganic sealing film, all of which are stacked in a stated order;
an outer damming wall provided in a frame area around the display area so as to surround the display area and overlapping an outer peripheral portion of the organic sealing film; and
an inner damming wall provided in a non-display area so as to surround a plurality of inner protrusions and overlapping an inner peripheral end portion of the organic sealing film, wherein
the non-display area that is insular is provided inside the display area,
a through hole extending through the resin substrate layer in a direction of a thickness of the resin substrate layer is provided in the non-display area,
the plurality of inner protrusions is provided in the non-display area so as to surround the through hole,
each of the plurality of inner protrusions includes:
an underlying resin layer including the resin substrate layer, and
an underlying inorganic insulation layer provided on the underlying resin layer and made of a same material and in a same layer as the underlying inorganic insulation film,
the underlying resin layer in each of the plurality of inner protrusions is separated by a plurality of inner slits formed on a surface on an underlying inorganic insulation film side of the resin substrate layer so as to surround the through hole,
the underlying inorganic insulation layer is provided so as to project like an eave from the underlying resin layer to either one or both of a through hole side and a display area side,
one of the plurality of inner slits that is closest to an inner damming wall side includes an eave portion in which the underlying inorganic insulation film projects from the display area side to the through hole side,
an outer protrusion is annularly provided on a display area side of the inner damming wall in the non-display area so as to surround the inner damming wall,
the outer protrusion includes an overlying resin layer made of a same material and in a same layer as the organic insulation film,
the overlying resin layer is in contact with the organic sealing film via the first inorganic sealing film,
the thin film transistor layer further includes a first overlying inorganic insulation film provided on an upper layer side of the organic insulation film,
the outer protrusion further includes an overlying inorganic insulation layer provided on the overlying resin layer and made of a same material and in a same layer as the first overlying inorganic insulation film, and
the overlying inorganic insulation layer is provided so as to project like an eave from the overlying resin layer to either one or both of the inner damming wall side and the display area side.

2. The display device according to claim 1, wherein
the thin film transistor layer further includes a second overlying inorganic insulation film provided on an upper layer side of the underlying inorganic insulation film, and
the eave portion is in contact with the first inorganic sealing film via the second overlying inorganic insulation film.

3. The display device according to claim 2, wherein the underlying resin layer in each of the plurality of inner protrusions is in contact with the first inorganic sealing film via the second overlying inorganic insulation film.

4. The display device according to claim 1, wherein
an overlying wiring layer is provided on the upper layer side of the organic insulation film,
the outer protrusion further includes a metal layer provided on the overlying resin layer and made of a same material and in a same layer as the overlying wiring layer, and
the metal layer is provided so as to project like an eave from the overlying resin layer to either one or both of the inner damming wall side and the display area side.

5. The display device according to claim 4, wherein a power supply line is provided as the overlying wiring layer in the display area.

6. The display device according to claim 4, wherein the plurality of first electrodes is provided as the overlying wiring layer in the display area.

7. The display device according to claim 1, wherein
the resin substrate layer includes:
a first resin substrate layer provided opposite the thin film transistor layer,
a second resin substrate layer provided on a thin film transistor layer side, and
an intermediate inorganic insulation film provided between the first resin substrate layer and the second resin substrate layer, and
the plurality of inner slits is provided on a surface of the second resin substrate layer on the thin film transistor layer side.

8. The display device according to claim 1, wherein the common functional layer is an organic electroluminescence layer.

9. A display device comprising:
a resin substrate layer;
a thin film transistor layer provided on the resin substrate layer and including an underlying inorganic insulation film, an underlying wiring layer, and an organic insulation film, all of which are stacked in a stated order;
a light-emitting element layer provided on the thin film transistor layer and including a plurality of first electrodes, a common functional layer, and a second electrode that is common, all of which are stacked in a stated order, correspondingly to a plurality of subpixels included in a display area;
a sealing film provided so as to cover the light-emitting element layer and including a first inorganic sealing film, an organic sealing film, and a second inorganic sealing film, all of which are stacked in a stated order;

an outer damming wall provided in a frame area around the display area so as to surround the display area and overlapping an outer peripheral portion of the organic sealing film; and an inner damming wall provided in a non-display area so as to surround a plurality of inner protrusions and overlapping an inner peripheral end portion of the organic sealing film, wherein the non-display area that is insular is provided inside the display area, a through hole extending through the resin substrate layer in a direction of a thickness of the resin substrate layer is provided in the non-display area, the plurality of inner protrusions is provided in the non-display area so as to surround the through hole, each of the plurality of inner protrusions includes:
  an underlying resin layer including the resin substrate layer, and
  an underlying inorganic insulation layer provided on the underlying resin layer and made of a same material and in a same layer as the underlying inorganic insulation film, the underlying resin layer in each of the plurality of inner protrusions is separated by a plurality of inner slits formed on a surface on an underlying inorganic insulation film side of the resin substrate layer so as to surround the through hole, the underlying inorganic insulation layer is provided so as to project like an eave from the underlying resin layer to either one or both of a through hole side and a display area side, one of the plurality of inner slits that is closest to an inner damming wall side includes an eave portion in which the underlying inorganic insulation film projects from the display area side to the through hole side, an outer protrusion is annularly provided on a display area side of the inner damming wall in the non-display area so as to surround the inner damming wall, a terminal section is provided in an end region of the frame area, a bending portion is provided between the display area and the terminal section so as to extend in one direction, in the bending portion, the underlying inorganic insulation film has a linear slit extending in the one direction in which the bending portion extends, an injection layer is provided in the bending portion so as to fill in the linear slit, a plurality of routing lines is provided on the injection layer so as to extend parallel to each other in a direction intersecting with the one direction in which the bending portion extends, the outer protrusion includes:
  an overlying resin layer made of a same material and in a same layer as the injection layer, and
  a metal layer provided on the overlying resin layer and made of a same material and in a same layer as the underlying wiring layer, and the metal layer is provided so as to project like an eave from the overlying resin layer to either one or both of the inner damming wall side and the display area side.

10. The display device according to claim 9, wherein
the thin film transistor layer further includes a first overlying inorganic insulation film provided on an upper layer side of the underlying inorganic insulation film, and
the eave portion is in contact with the first inorganic sealing film via the first overlying inorganic insulation film.

11. The display device according to claim 10, wherein the underlying resin layer in each of the plurality of inner protrusions is in contact with the first inorganic sealing film via the first overlying inorganic insulation film.

12. The display device according to claim 9, wherein
the overlying resin layer is in contact with the organic sealing film via the first inorganic sealing film.

13. The display device according to claim 12, wherein
the thin film transistor layer further includes a second overlying inorganic insulation film provided on an upper layer side of the organic insulation film,
the outer protrusion further includes an overlying inorganic insulation layer provided on the overlying resin layer and made of a same material and in a same layer as the second overlying inorganic insulation film, and
the overlying inorganic insulation layer is provided so as to project like an eave from the overlying resin layer to either one or both of the inner damming wall side and the display area side.

14. The display device according to claim 13, wherein
an overlying wiring layer is provided on the upper layer side of the organic insulation film.

15. The display device according to claim 14, wherein a power supply line is provided as the overlying wiring layer in the display area.

16. The display device according to claim 14, wherein the plurality of first electrodes is provided as the overlying wiring layer in the display area.

17. The display device according to claim 9, wherein
the resin substrate layer includes:
  a first resin substrate layer provided opposite the thin film transistor layer,
  a second resin substrate layer provided on a thin film transistor layer side, and
  an intermediate inorganic insulation film provided between the first resin substrate layer and the second resin substrate layer, and
the plurality of inner slits is provided on a surface of the second resin substrate layer on the thin film transistor layer side.

18. The display device according to claim 9, wherein the common functional layer is an organic electroluminescence layer.

* * * * *